US006700828B2

(12) United States Patent
Mizugaki

(10) Patent No.: US 6,700,828 B2
(45) Date of Patent: Mar. 2, 2004

(54) SEMICONDUCTOR MEMORY DEVICE

(75) Inventor: Koichi Mizugaki, Tokyo (JP)

(73) Assignee: Seiko Epson Corporation, Tokyo (JP)

( * ) Notice: Subject to any disclaimer, the term of this patent is extended or adjusted under 35 U.S.C. 154(b) by 36 days.

(21) Appl. No.: 10/268,782

(22) Filed: Oct. 11, 2002

(65) Prior Publication Data

US 2003/0081487 A1 May 1, 2003

(30) Foreign Application Priority Data

Oct. 26, 2001 (JP) ......................................... 2001-329005

(51) Int. Cl.[7] ............................... G11C 7/00; G11C 8/00
(52) U.S. Cl. ..................... 365/222; 365/233.5; 365/233; 365/194; 365/236; 365/230.08; 365/230.03
(58) Field of Search ................................ 365/222, 194, 365/230.03, 230.08, 233, 236

(56) References Cited

U.S. PATENT DOCUMENTS

2003/0112668 A1 * 6/2003 Takahashi et al. .......... 365/200

* cited by examiner

*Primary Examiner*—Hoai Ho
*Assistant Examiner*—Ly Duy Pham
(74) *Attorney, Agent, or Firm*—Oliff & Berridge, PLC

(57) ABSTRACT

The technique of the present invention sets a time period of a level H between a rise and a fall of an ATD signal (that is, a pulse width of the ATD signal) to be not shorter than a preset allowable address skew range and not longer than a time period between a timing of a rise of the ATD signal, at which the refreshing operation starts, and conclusion of the refreshing operation. This arrangement ensures generation of an appropriate ATD signal even when an address skew occurs in an externally given address.

3 Claims, 16 Drawing Sheets

Fig.2

|  | #CS | ZZ | REFRESH MODE (Notes) |
|---|---|---|---|
| OPERATION | L | H | MODE 1 |
| STAND-BY | H | H | MODE 1 |
| SNOOZE (POWER DOWN) | H | L | MODE 2 |

(Notes)
   Refresh Mode 1: Refreshing is executed synchronously with an ATD signal after generation of a refresh timing signal in a memory chip Refresh Mode 2: Refreshing is executed in response to generation of a refresh timing signal in a memory chip (input of an address is not required)

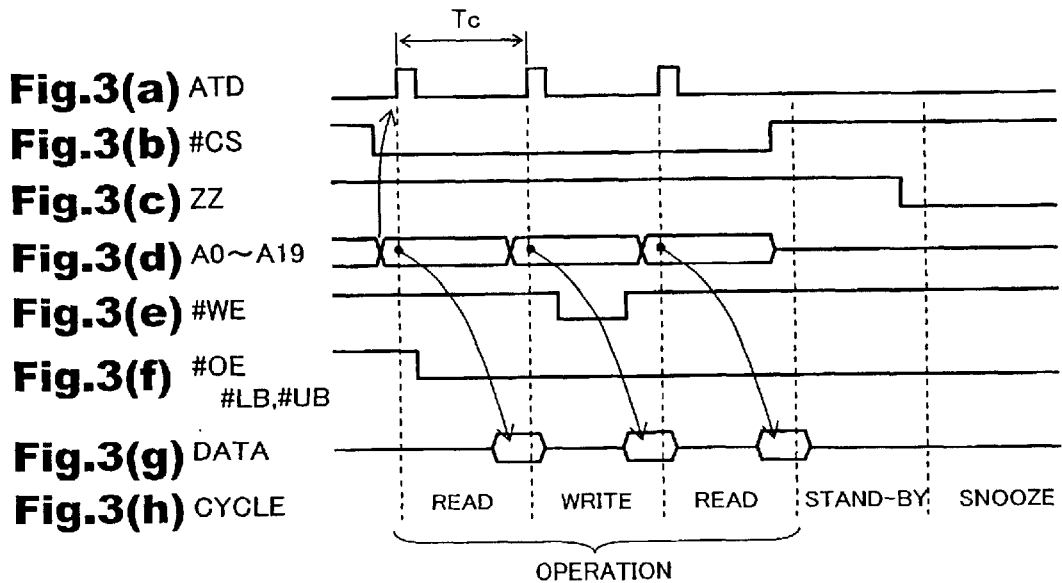

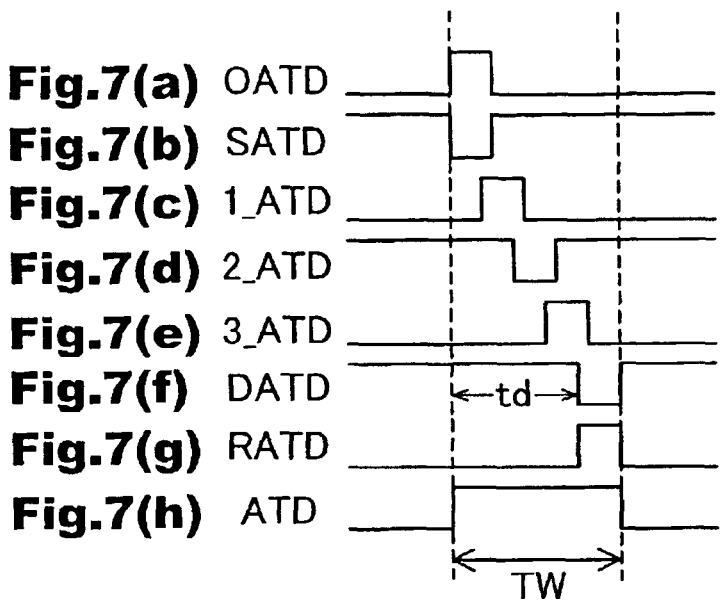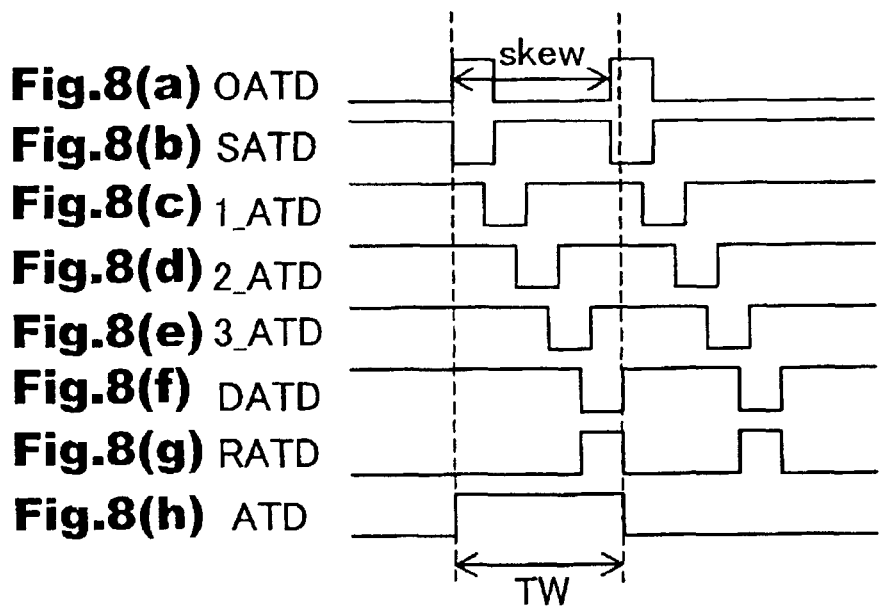

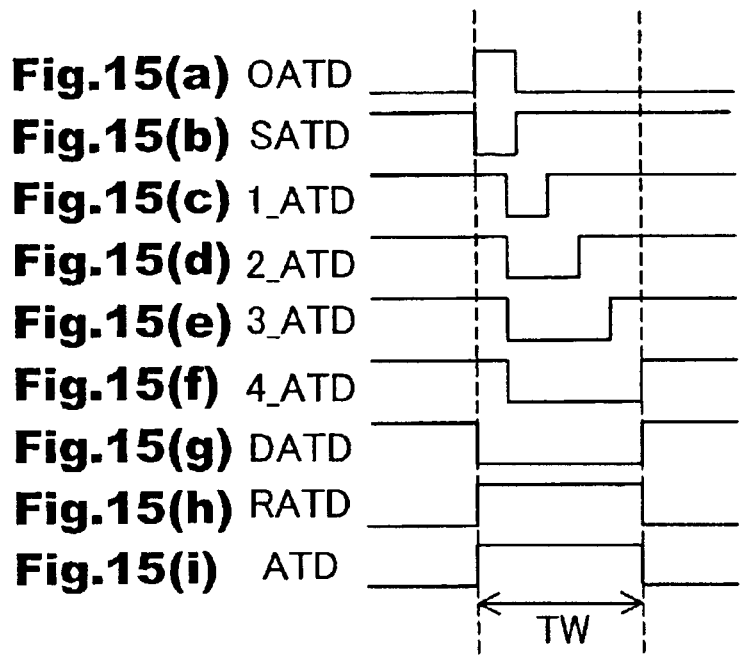
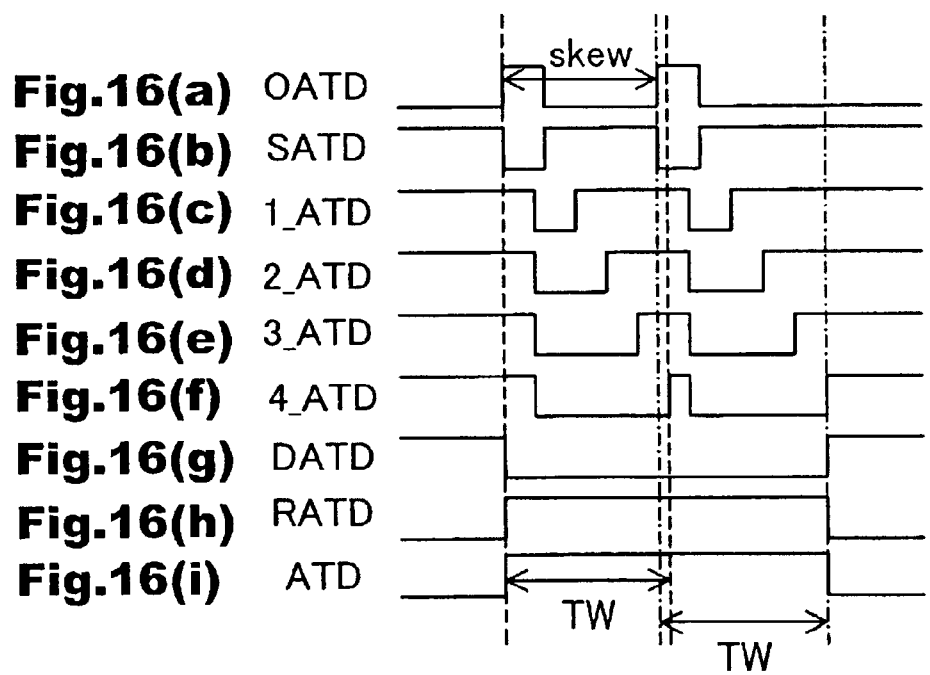

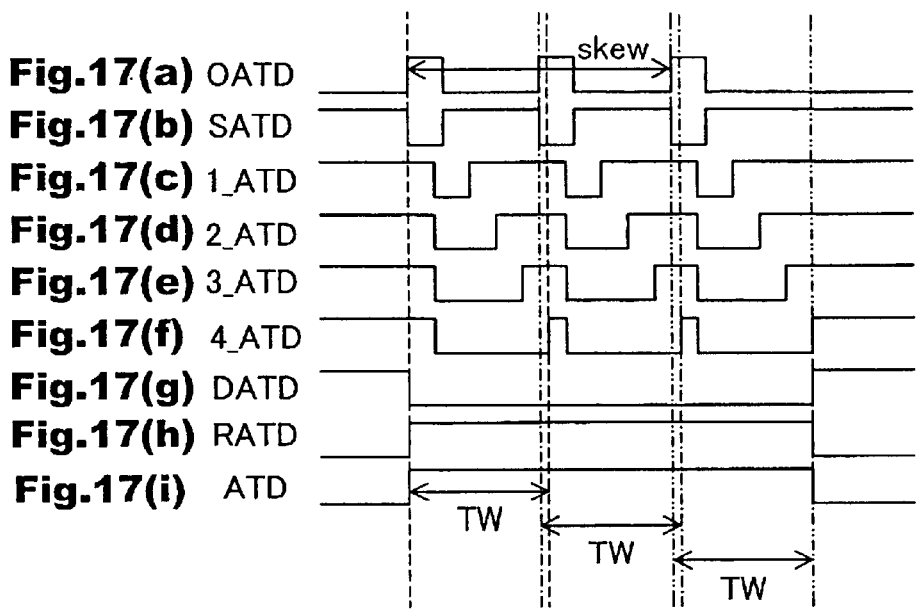
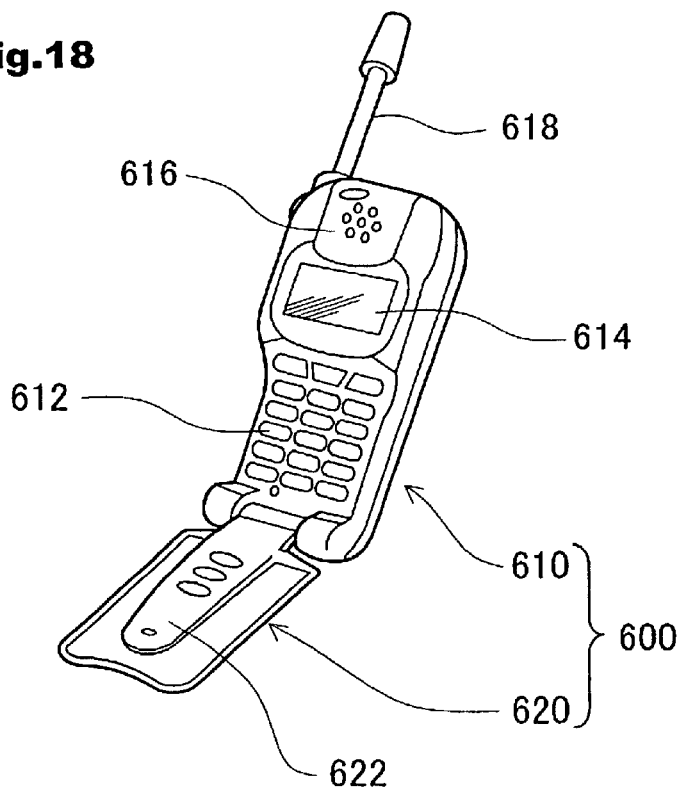

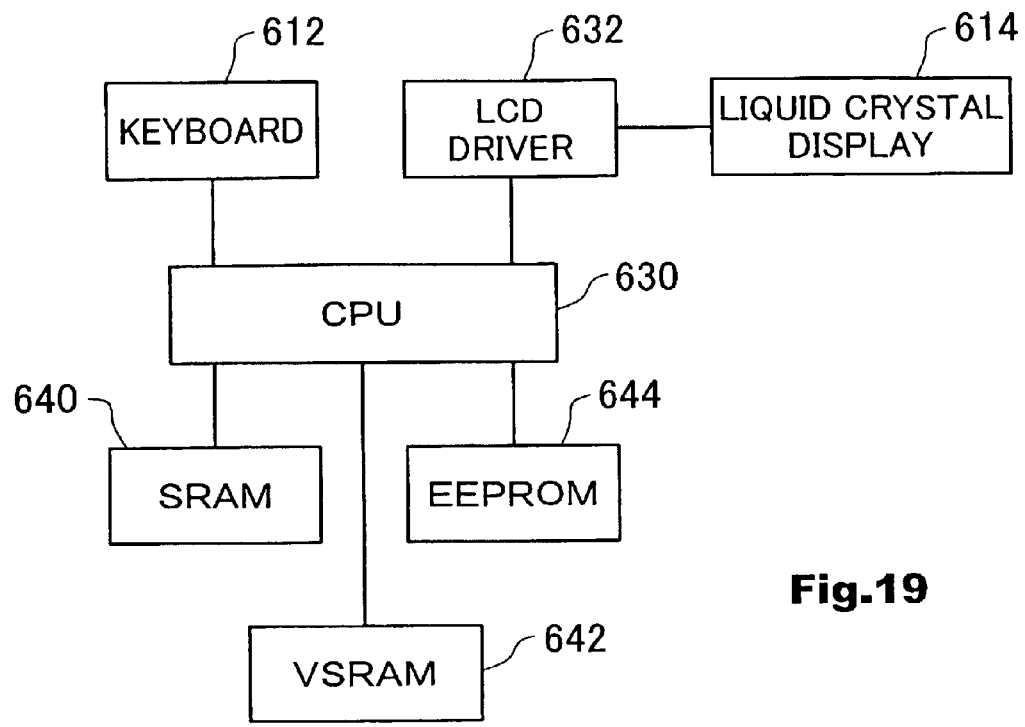
Fig.19
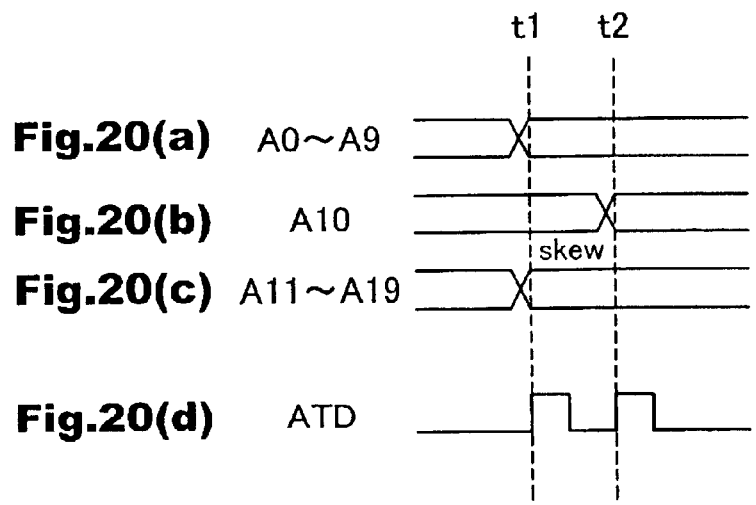

SEMICONDUCTOR MEMORY DEVICE

BACKGROUND OF THE INVENTION

1. Field of the Invention

The present invention relates to setting of a pulse width of an address transition signal in a semiconductor memory device.

2. Description of the Related Art

Typical examples of the semiconductor memory device include a DRAM and an SRAM. As is well known, the DRAM is more affordable in price and has a larger capacity than the SRAM, but requires the refreshing operation. The SRAM does not require any refreshing operation and is easily handled, but is more expensive and has a smaller capacity than the DRAM.

A virtual SRAM (called VSRAM or PSRAM) is known as a semiconductor memory device having the advantages of the DRAM and the SRAM. The virtual SRAM has a memory cell array of dynamic memory cells like the DRAM, and includes a refresh controller to perform the internal refreshing operation. An external device (for example, a CPU) connecting with the virtual SRAM can thus gain access to the virtual SRAM (for reading or writing data) without being specifically conscious of the refreshing operation. This characteristic of the virtual SRAM is referred to as 'permeability of refresh'.

Some virtual SRAMs do not require input of an external clock signal. Such a virtual SRAM includes an address transition detection circuit, which detects a variation of an address supplied from an external device (for example, a CPU) by at least one bit and generates an address transition signal based on a result of the detection. Namely the address transition signal is used instead of the external clock signal. The external device (for example, the CPU) gains access to the virtual SRAM with the address transition detection circuit by the same procedure as that for accessing a conventional asynchronous SRAM.

In the description below, the address transition detection circuit may be referred to as the 'ATD circuit', and the address transition signal may be referred to as the 'ATD signal'.

The address supplied from the external device (for example, the CPU) to the virtual SRAM is generally transmitted in parallel by means of multiple (for example, 20) signal lines. Each signal line corresponds to one bit. In the case of a variation in address from a certain value to another value, it is preferable to simultaneously change all the bits involved in the address variation among the respective bits transmitted via the multiple signal lines.

When all the bits involved in the address variation are changed simultaneously, the ATD circuit included in the virtual SRAM accurately detects the address variation and ensures generation of an appropriate ATD signal.

In the actual state, however, a variation of the circuit elements or a variation of the signal lines causes a phase difference or a timing difference among the bits. The respective bits involved in the address variation may thus be changed at deviated timings. Such deviation of the timing is generally called an address skew.

In the prior art technique, the ATD circuit may not accurately detect the address variation nor generate the appropriate ATD signal under the condition of occurrence of an address skew.

FIG. 20 is a timing chart showing a variation in level of the ATD signal and external access executed in response to the ATD signal in the case of occurrence of an address skew in the prior art technique.

The address supplied to the virtual SRAM is 20-bit data of A0 through A19. The bits A0 through A9 are changed as shown in FIG. 20(a), the bit A10 is changed as shown in FIG. 20(b), and the bits A11 through A19 are changed as shown in FIG. 20(c). In this example, the bits other than the bit A10 are changed at a time point t1, whereas the bit A10 is changed at a later time point t2. Namely the timing of the change of the bit A10 is deviated from the timing of the change of the other bits. This causes an address skew.

In the case of the occurrence of the address skew, the ATD circuit detects a change of the bits other than the bit A10 at the time point t1 and makes the ATD signal rise to have a pulse of a fixed width as shown in FIG. 20(d). The ATD circuit then detects a change of the bit A10 at the time point t2 and makes the ATD signal rise again to have another pulse of the fixed width.

While it is expected that the ATD signal rises to have one pulse in response to detection of the address variation, the prior art technique makes the ATD signal rise to have two pulses within a short time. This prevents generation of the appropriate ATD signal.

As described above, the ATD signal is used in place of the external clock signal in the virtual SRAM and represents a reference timing of external access to the memory cell array or a refreshing operation of the memory cell array. More specifically, the refreshing operation starts based on the timing of a rise of the ATD signal, whereas the external access starts in principle based on the timing of a rise of the ATD signal.

The hindrance of generation of the appropriate ATD signal causes malfunctions of the external access and the refreshing operation. In the worst case, destruction of data may occur in part of the memory cells included in the memory cell array.

The longer pulse width of the ATD signal leads to the longer access time as discussed later. The prior art technique thus sets the pulse width of the ATD signal to several nsec, which ensures absorption of noise.

SUMMARY OF THE INVENTION

The object of the present invention is thus to provide a semiconductor memory device that generates an appropriate address transition signal even in the case of occurrence of an address skew in an externally given address.

In order to attain at least part of the above and the other related objects, the present invention is directed to a first semiconductor memory device, which includes: a memory cell array of dynamic memory cells; an address transition detection module that detects a variation of an externally given address by at least one bit and generates an address transition detection signal, which shifts to a second state in response to detection of the variation of the address in a first state and re-shifts to the first state when a preset reference time period elapses since the shift to the second state; a refresh control module that starts a refreshing operation of a desired memory cell included in the memory cell array, based on a timing of the shift of the address transition detection signal from the first state to the second state; and an external access control module that starts an external access to a memory cell in the memory cell array specified by the externally given address, based on a timing of the re-shift of the address transition detection signal from the second state to the first state or a timing of conclusion of the refreshing operation. The reference time period is set to be not shorter than a preset allowable address skew range with regard to the address and not to be longer than a time period between the shift of the address transition detection signal to the second state and the conclusion of the refreshing operation.

In the first semiconductor memory device of the present invention, the refreshing operation starts, based on the timing of the shift of the address transition detection signal from the first state to the second state. The external access starts, based on the timing of the re-shift of the address transition detection signal from the second state to the first state or the timing of conclusion of the refreshing operation. The allowable address skew range is set in advance. On these premises, the reference time period of the address transition detection signal is set to be not shorter than the preset allowable address skew range and not to be longer than the time period between the shift of the address transition detection signal to the second state and the conclusion of the refreshing operation. Here the reference time period of the address transition detection signal denotes the time period between the timing of the shift from the first state to the second state and the timing of the re-shift from the second state to the first state.

In the first semiconductor memory device of the present invention, the address transition detection signal does not re-shift from the second state to the first state during the preset reference time period, even in the case of occurrence of an address skew. Setting the reference time period of the address transition detection signal to be not shorter than the preset allowable address skew range effectively prevents frequent shift and re-shift of the state of the address transition detection signal within a short time and ensures generation of an appropriate address transition detection signal.

The external access starts, based on the timing of the re-shift of the address transition detection signal from the second state to the first state. Setting the reference time period of the address transition detection signal to be not shorter than the preset allowable address skew range extremely lowers the probability of occurrence of an address skew after the start of the external access. This arrangement thus ensures a normal operation of external access without any effects of the occurrence of an address skew.

Counting of the access time generally starts at the time point of a variation in address (that is, at the timing of the shift of the address transition detection signal from the first state to the second state). The longer reference time period of the address transition detection signal causes a delay in starting time of the external access and thereby lengthens the access time. When a requirement of refresh and a requirement of external access are simultaneously given to an identical memory cell included in the memory cell array, the external access starts based on the timing of the conclusion of the refreshing operation. The maximum access time is thus not shorter than the time period between the time point of the variation in address and the conclusion of the refreshing operation. In the first semiconductor memory device of the present invention, the reference time period of the address transition detection signal is set to be not longer than the time period between the shift of the address transition detection signal to the second state and the conclusion of the refreshing operation. The maximum access time is thus within the above range of the access time in the case of the simultaneous requirements of refresh and external access.

The present invention is also directed to a second semiconductor memory device, which includes: a memory cell array of dynamic memory cells; an address transition detection module that detects a variation of an externally given address by at least one bit and generates an address transition detection signal, which shifts to a second state in response to detection of the variation of the address in a first state and re-shifts to the first state when a preset reference time period elapses since the shift to the second state; a refresh control module that starts a refreshing operation of a desired memory cell included in the memory cell array, based on a timing of the shift of the address transition detection signal from the first state to the second state; and an external access control module that starts an external access to a memory cell in the memory cell array specified by the externally given address, based on a timing of the re-shift of the address transition detection signal from the second state to the first state or a timing of conclusion of the refreshing operation. The reference time period is set to a specific length, which is not shorter than a preset allowable address skew range with regard to the address. The address transition detection module extends the reference time period in response to detection of the variation of the address while the address transition detection signal is in the second state.

In the second semiconductor memory device of the present invention, the reference time period of the address transition detection signal is set to a specific length, which is not shorter than the preset allowable address skew range. In the case of detection of a variation in address while the address transition detection signal is in the second state, the technique extends the reference time period of the address transition detection signal.

In the semiconductor memory device of the present invention, the reference time period of the address transition detection signal is automatically extended in response to occurrence of an address skew while the address transition detection signal is in the second state. This arrangement effectively prevents frequent shift and re-shift of the state of the address transition detection signal within a short time and ensures generation of an appropriate address transition detection signal.

As described above, the external access starts, based on the timing of the re-shift of the address transition detection signal from the second state to the first state. This arrangement extremely lowers the probability of occurrence of an address skew after the start of the external access and thus ensures a normal operation of external access without any effects of the occurrence of an address skew.

The address is indefinite during the occurrence of an address skew. The occurrence of the address skew extends the reference time period of the address transition detection signal and accordingly causes a delay in starting time of the external access. This, however, does not lengthen the substantial access time, which starts counting at the time of the last variation in address under the condition of the occurrence of the address skew. The extension of the reference time period thus does not cause any significant problems.

In one preferable application of the second semiconductor memory device of the present invention, the address transition detection module extends the reference time period to maintain the second state for a predetermined time in response to detection of the variation of the address while the address transition detection signal is in the second state.

Even in the case of the occurrence of an address skew, this arrangement causes the address transition detection signal to keep its second state for the predetermined time since the detection of the variation in address. The address transition detection signal thus ensures absorption of the address skew.

The technique of the present invention is not restricted to the semiconductor memory device but may be actualized by a diversity of electronic apparatuses with the semiconductor memory device mounted thereon. Another application of the present invention is a method of generating an address transition detection signal.

The above and other objects, features, aspects, and advantages of the present invention will become more apparent from the following detailed description of the preferred embodiments with the accompanying drawings.

BRIEF DESCRIPTION OF THE DRAWINGS

FIG. 2 shows the working status of the memory chip 300 according to the signal levels of a chip select signal #CS and a snooze signal ZZ;

FIGS. 3(a)–(h) are timing charts showing the operations of the memory chip 300;

FIGS. 7(a)–(h) are timing charts showing variations in level of relevant signals in FIGS. 5 and 6;

FIGS. 8(a)–(h) are timing charts showing variations in level of the relevant signals in FIGS. 5 and 6 in the case of occurrence of an address skew;

FIGS. 15(a)–(i) are timing charts showing variations in level of relevant signals in FIGS. 5 and 14;

FIGS. 16(a)–(i) are timing charts showing variations in level of relevant signals in FIGS. 5 and 14 in the case of occurrence of an address skew;

FIGS. 17(a)–(i) are timing charts showing variations in level of relevant signals in FIGS. 5 and 14 in the case of successive occurrence of address skews;

FIG. 18 is a perspective view illustrating a cellular phone 600 as one application of the semiconductor device of the present invention to an electronic apparatus;

FIG. 19 is a block diagram illustrating the electrical construction of the cellular phone 600 shown in FIG. 18; and FIGS. 20(a)–(d) are timing charts showing a variation in level of an ATD signal and external access executed in response to the ATD signal in the case of occurrence of an address skew in a prior art technique.

DESCRIPTION OF THE PREFERRED EMBODIMENTS

Figure 1:
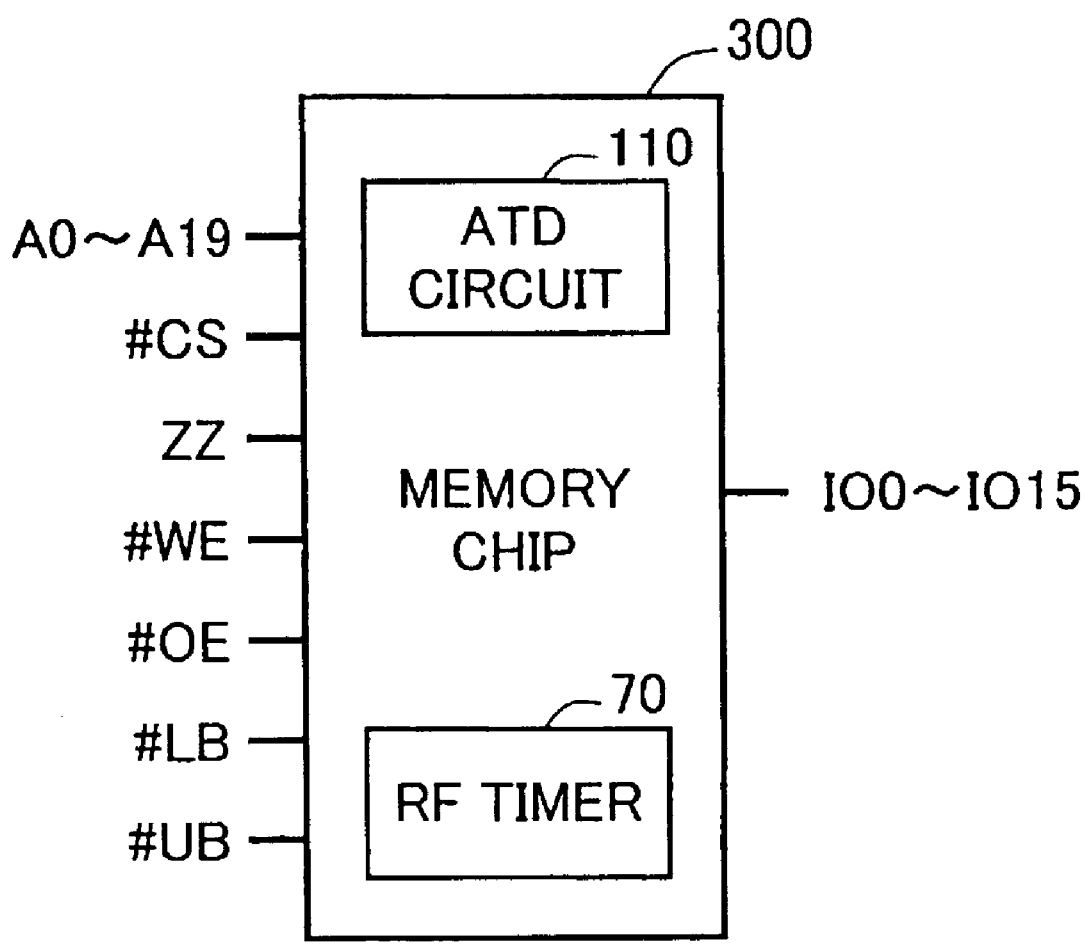
FIG. 1 shows the terminal structure of a memory chip 300 in one embodiment of the present invention.

Some modes of carrying out the present invention are discussed below as preferred embodiments in the following sequence:
A. Terminal Structure of Memory Chip and Outline of Working Status
B. General Internal Structure of Memory Chip
C. Generation of ATD Signal
D. Construction and Operations of Refresh Controller and External Access Controller
E. Operations for External Access and Refresh in response to ATD Signal
F. Another Embodiment
G. Application to Electronic Apparatus
H. Modifications
A. Terminal Structure of Memory Chip and Outline of Working Status FIG. 1 schematically illustrates the terminal structure of a memory chip 300 in one embodiment of the present invention. The memory chip 300 has multiple terminals given below:

A0 through A19: (20) Address input terminals
CS: Chip select input terminal
ZZ: Snooze input terminal
WE: Write enable input terminal
OE: Output enable input terminal
LB: Lower byte enable input terminal
UB: Upper byte enable input terminal
IO0 through IO15: (16) Input-output data terminals In the description hereafter, an identical symbol is assigned commonly for both the terminal name and the signal name. The prefix '#' attached to the head of each terminal name (signal name) represents negative logic. Although there are multiple address input terminals A0 through A19 and input-output data terminals IO0 through IO15, they are simplified in the illustration of FIG. 1.

The memory chip 300 is constructed as a virtual SRAM (VSRAM) that is accessible by the same procedure as that for a conventional asynchronous SRAM. Unlike the SRAM, however, the VSRAM uses dynamic memory cells and requires refreshing in every predetermined time period. A refresh controller including a refresh timer 70 is accordingly built in the memory chip 300. In the specification hereof, data reading and writing operations from an external device (a control device) are referred to as 'external access', and refreshing operations executed by the built-in refresh controller are referred to as 'internal refresh' or simply 'refresh'.

The memory chip 300 includes an address transition detection (ATD) circuit 110, which detects a variation of the input address A0 through A19 by at least one bit. The respective circuits in the memory chip 300 work in response to an address transition (ATD) signal supplied from the address transition detection circuit 110. For example, adjustment of the external access and the internal refresh is based on the address transition signal.

The chip select signal #CS and the snooze signal ZZ shown in FIG. 1 are used to regulate the working status of the memory chip 300. FIG. 2 shows the working status of the memory chip 300 according to the signal levels of the chip select signal #CS and the snooze signal ZZ. In the specification hereof, 'level H' denotes a level '1', which is one of two levels of a binary signal, whereas 'level L' denotes a level '0', which is the other of the two levels of the binary signal.

When the chip select signal #CS is at the level L (active) and the snooze signal ZZ is at the level H, a read/write operation cycle is carried out (hereinafter may simply be referred to as 'operation cycle' or 'read/write cycle'). In the operation cycle, external access is permitted, while internal refresh is executed at adequate timings.

When both of the chip select signal #CS and the snooze signal ZZ are at the level H, a stand-by cycle is carried out. In the stand-by cycle, external access is prohibited, and all word lines are inactivated. During the internal refresh, however, a specific word line specified by a refresh address is activated.

When the chip select signal #CS is at the level H (inactive) and the snooze signal ZZ is at the level L, the memory chip 300 shifts into a snooze status (also referred to as 'power-down status'). In the snooze status, all circuits other than those required for the refreshing operation are ceased. The snooze status has extremely small power consumption and is thus suitable for data backup in the memory.

The refresh is executed in a first refresh mode in the operation cycle and in the stand-by cycle, and is executed in a second refresh mode in the snooze status. In the first refresh mode, the refreshing operation starts synchronously with the ATD signal after generation of a refresh timing signal by a refresh timer 70. In the second refresh mode, on the other hand, the refreshing operation starts immediately after generation of the refresh timing signal by the refresh timer 70. The refreshing operation in the second refresh mode is asynchronous with the ATD signal and accordingly does not require input of an address A0 through A19. The memory chip 300 executes refreshing in the suitable refresh mode corresponding to each of the three working statuses.

The address data A0 through A19 shown in FIG. 1 is 20-bit data and specifies an address of 1 mega word. The input-output data IO0 through IO15 is 16-bit data corresponding to 1 word. Namely each value of the address A0 through A19 corresponds to 16 bits (1 word), and allows simultaneous input or output of the 16-bit input-output data IO0 through IO15.

In the operation cycle, a write cycle is carried out when the write enable signal #WE is at the level L, whereas a read cycle is carried out when the write enable signal #WE is at the level H. Output from the input-output data terminals IO0 through IO15 is allowed when the output enable signal #OE is at the level L. The lower byte enable signal #LB and the upper byte enable signal #UB are control signals for reading or writing only one byte out of the lower byte and the upper byte of 1 word (16 bits). For example, when the lower byte enable signal #LB is set at the level L and the upper byte enable signal #UB is set at the level H, the reading or writing operation is executed for only the lower 8 bits of 1 word. A power terminal is omitted from the illustration of FIG. 1.

FIG. 3 is a timing chart showing the operations of the memory chip 300. The current working status among the three working statuses (operation, stand-by, snooze) shown in FIG. 2 is specified at adequate timings according to variations in level of the chip select signal #CS and the snooze signal ZZ. The first three cycles in FIG. 3 are in the operation cycle. In the operation cycle, either the read operation (read cycle) or the write operation (write cycle) is executed according to the level of the write enable signal #WE. A minimum period Tc of the ATD signal (that is, a minimum period of the variation of the address A0 through A19) corresponds to a cycle time (also referred to as 'cycle period') of this memory chip 300. The cycle time Tc is set, for example, in a range of about 50 ns to about 100 ns.

At the fourth cycle in FIG. 3, the chip select signal #CS has risen to the level H, so that the stand-by cycle starts. At the fifth cycle, the snooze signal ZZ has fallen to the level L, so that the memory chip 300 shifts to the snooze status. No ATD signal is generated during no variation of the address A0 through A19 as shown in FIG. 3(a).

B. General Internal Structure of Memory Chip

Figure 4:
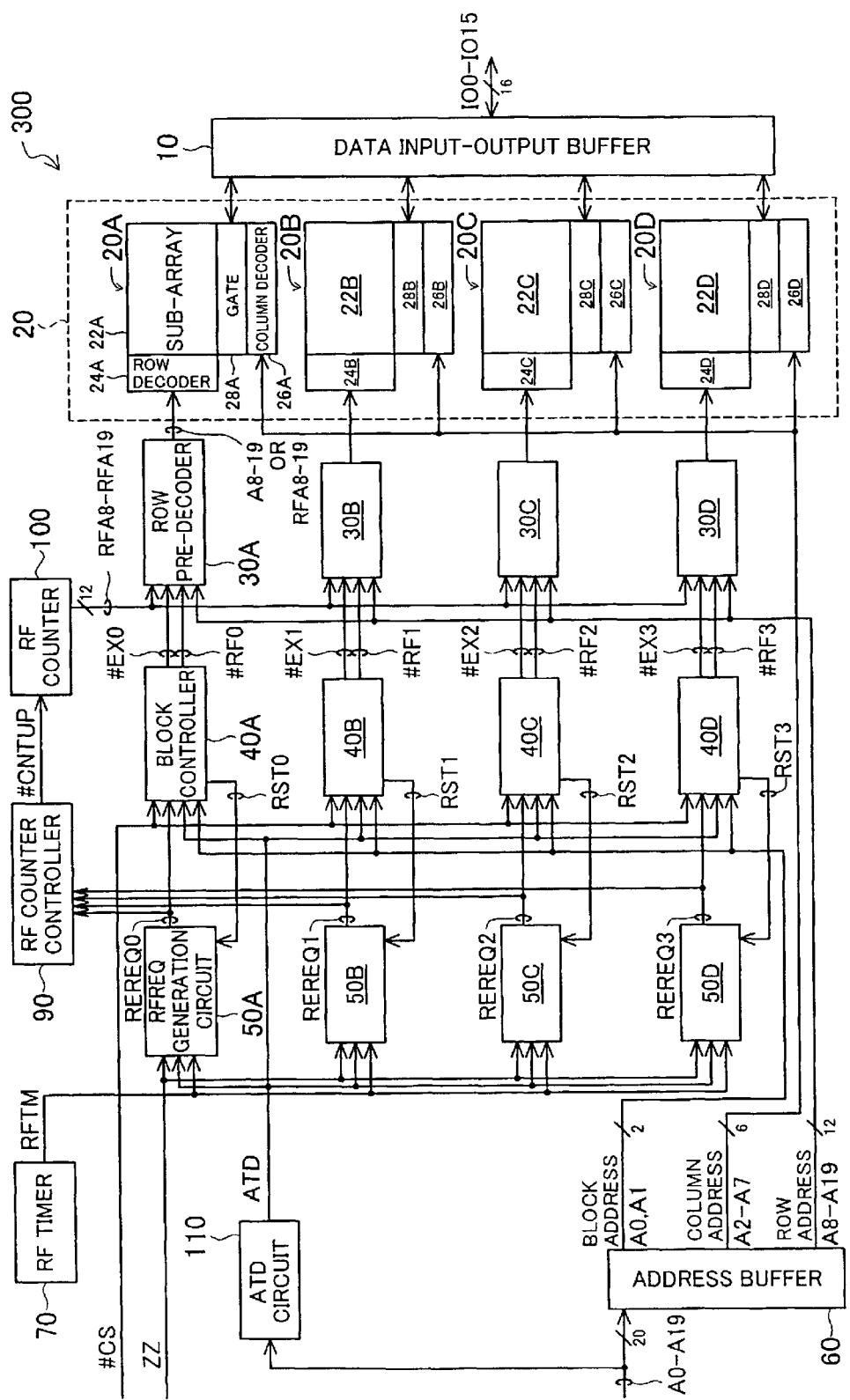
FIG. 4 is a block diagram illustrating the structure of the memory chip 300.

FIG. 4 is a block diagram illustrating the internal structure of the memory chip 300. This memory chip 300 has a data input-output buffer 10, a memory cell array 20, and an address buffer 60.

The memory cell array 20 is divided into four blocks 20A through 20D. The first block 20A has a memory cell sub-array 22A, a row decoder 24A, a column decoder 26A, and a gate 28A. The other blocks 20B through 20D have similar constituents. Since the respective blocks 20A through 20D have substantially the same structure, the following description mainly regards the first block 20A and other circuits related thereto.

The structure of each block 20A is similar to that of a typical DRAM memory cell array. The sub-array 22A has a plurality of one-transistor, one-capacitor-type memory cells arranged in a matrix. Each memory cell is connected with a word line and a bit line pair (also referred to as data line pair). The row decoder 24A includes a row driver and activates selected one of multiple word lines in the sub-array 22A according to a given row address. The column decoder 26A includes a column driver and simultaneously selects bit line pairs of 1 word (16 bits) among multiple bit line pairs in the sub-array 22A according to a given column address. The gate 28A includes a reading circuit and a writing circuit and allows data transmission between the data input-output buffer 10 and the sub-array 22A. The block 20A also includes non-illustrated other constituents, such as a pre-charge circuit and a sense amplifier.

The address buffer 60 is a circuit for supplying a 20-bit address A0 through A19 transmitted from an external device to the other internal circuits. The lower-most 2-bit address A0 and A1 specifies a block address for selecting one among the four blocks 20A through 20D. The 6-bit address A2 through A7 upper than the block address A0 and A1 specifies a column address, and the upper-most 12-bit address A8 through A19 specifies a row address. The block address A0 and A1 selects one of the four blocks 20A through 20D, and the column address A2 through A7 and the row address A8 through A19 select memory cells of 1 word (16 bits) in the selected block. Data of 1 word corresponding to the selected memory cells are read or written via the data input-output buffer 10. The external device gains simultaneous access to the memory cells of 1 word in the selected block by input of one address A0 through A19.

Row pre-decoders 30A through 30D, block controllers 40A through 40D, and refresh requirement signal generation circuits 50A through 50D are connected in this sequence to the respective blocks 20A through 20D. The memory chip 300 also includes the refresh timer 70, a refresh counter controller 90, a refresh counter 100, and the ATD (address transition detection) circuit 110.

The ATD circuit 110, which is characteristic of the present invention, detects a variation of the 20-bit address A0 through A19 given from the external device by at least one bit and generates the ATD signal in response to the detected variation of the address. The construction and the operations of the ATD circuit 110 will be discussed in detail later.

The refresh timer 70 shown in FIG. 4 is a circuit of generating a refresh timing signal RFTM at every fixed refresh period. A ring oscillator is, for example, applied for the refresh timer 70. The refresh period is set, for example, equal to about 32 $\mu$s.

The refresh requirement signal generation circuits 50A through 50D respectively generate refresh requirement signals RFREQ0 through RFREQ3, which correspond to the respective blocks 20A through 20D, in response to the refresh timing signal RFTM supplied from the refresh timer 70 and the ATD signal supplied from the ATD circuit 110. The refresh requirement signals RFREQ0 through RFREQ3 are respectively supplied to the corresponding block controllers 40A through 40D.

The block controllers 40A through 40D receive the block address A0 and A1 given from the external device, as well as the refresh requirement signals RFREQ0 through RFREQ3 and the ATD signal. The refresh requirement signals RFREQ0 through RFREQ3 require start of the refreshing operation in the corresponding four blocks 20A through 20D. In the operation cycle, the block address A0 and A1 specifies the destination of the required external access among the four blocks 20A through 20D. The block controllers 40A through 40D accordingly adjust the external access and the internal refresh with regard to the four blocks 20A through 20D in response to these refresh requirement signals RFREQ0 through RFREQ3 and the block address A0 and A1. A concrete procedure of the adjustment sets the output levels of external access execution signals #EX0 through #EX3 and refresh execution signals #RF0 through #RF3.

The row pre-decoders 30A through 30D respectively select either one of the row address A8 through A19 given from the external device and a refresh address RFA8 through RFA19 given from the refresh counter 100 according to the levels of the external access execution signals #EX0 through #EX3 and the refresh execution signals #RF0 through #RF3, and supply the selected address to the row decoders 24A through 24D. Each row pre-decoder independently carries out the selection out of the two addresses A8 through A19 and RFA8 through RFA19. For example, when a requirement of external access is given to the first block 20A in the presence of a requirement of refresh, the row pre-decoders 30A through 30D respectively select the refresh address RFA8 through RFA19 and supply the selected refresh address RFA8 through RFA19 to the corresponding blocks 20A through 20D. The first row pre-decoder 30A selects the row address A8 through A19 and supplies the selected row address A8 through A19 to the first block 20A after completion of the refresh in the first block 20A.

The structures and the operations of the refresh requirement signal generation circuits 50A through 50D, the block controllers 40A through 40D, and the row pre-decoders 30A through 30D will be discussed in detail later.

The refresh counter controller 90 detects conclusion of the refreshing operation in all of the four blocks 20A through 20D in response to the same refresh address RFA8 through RFA19. The detection is implemented by checking the variation in signal level of the four refresh requirement signals RFREQ0 through RFREQ3. On conclusion of the refreshing operation in the four blocks 20A through 20D, the refresh counter controller 90 supplies a count up signal #CNTUP to the refresh counter 100. The refresh counter 100 counts up the value of the refresh address RFA8 through RFA19 by one in response to this count up signal #CNTUP.

The memory chip 300 has a controller for controlling the working status of the internal circuits in response to the chip select signal #CS and the snooze signal ZZ and a controller for controlling the input and output status in response to the various enable signals #WE, #OE, #UB, and #LB, in addition to the circuit elements shown in FIG. 4. These controllers are omitted from the illustration of FIG. 4 as a matter of convenience.

The memory cell array 20 and the ATD circuit 110 in the circuit of the embodiment shown in FIG. 4 correspond to the 'memory cell array' and the 'address transition detection module' of the present invention, respectively. The circuit structure defined by the row pre-decoders 30A through 30D, the block controllers 40A through 40D, the refresh requirement signal generation circuits 50A through 50D, the refresh timer 70, the refresh counter controller 90, and the refresh counter 100 correspond to the 'refresh control module' of the present invention. The circuit structure defined by the row pre-decoders 30A through 30D, the block controllers 40A through 40D, and the address buffer 60 correspond to the 'external access control module' of the present invention. Namely the row pre-decoders 30A through 30D and the block controllers 40A through 40D function as both the part of the 'refresh control module' and the part of the 'external access control module'.

C. Generation of ATD Signal

The following describes the detailed process of setting the time period of the level H between a rise and a fall of the ATD signal (that is, the pulse width of the ATD signal), which is characteristic of the present invention.

As mentioned previously, in the virtual SRAM with the ATD circuit, the ATD signal is used instead of the external clock signal to show a reference timing of the external access to the memory cell array and the refresh of the memory cell array.

In the arrangement of this embodiment, the refresh starts at a timing of a rise of the ATD signal generated by the ATD circuit 110, and the external access starts at a timing of a rise of the ATD signal, as described in detail later.

In the case where a requirement of refresh and a requirement of external access are simultaneously given to an identical block in the memory cell array, the procedure first starts the refreshing operation at a timing of a rise of the ATD signal and then starts the external access on conclusion of the refreshing operation.

An address skew may occur in the address supplied from an external device (for example, a CPU) to the semiconductor memory device, due to variations of circuit elements and signal lines, as discussed previously. On the premise of the occurrence of address skew, an allowable address skew range is generally set in the semiconductor memory device. The allowable address skew range represents an allowable level of address skew or a maximum level of address skew to which proper operation is guaranteed. The allowable address skew range is typically 10 to 20 nsec.

The procedure of the embodiment takes into account the reference timing of the ATD signal for the external access and the refresh and a preset allowable address skew range as the premises. With a view to eliminating the effects of the occurrence of address skew, the procedure of the embodiment sets the time period of the H level between a rise and a fall of the ATD signal (that is, the pulse width of the ATD signal) to be not shorter than the preset allowable address skew range and not longer a time period between a timing of a rise of the ATD signal, at which the refreshing operation starts, and conclusion of the refreshing operation.

The following describes how the ATD circuit 110 generates the ATD signal having the time period of the level H set in the above manner.

Figure 5:
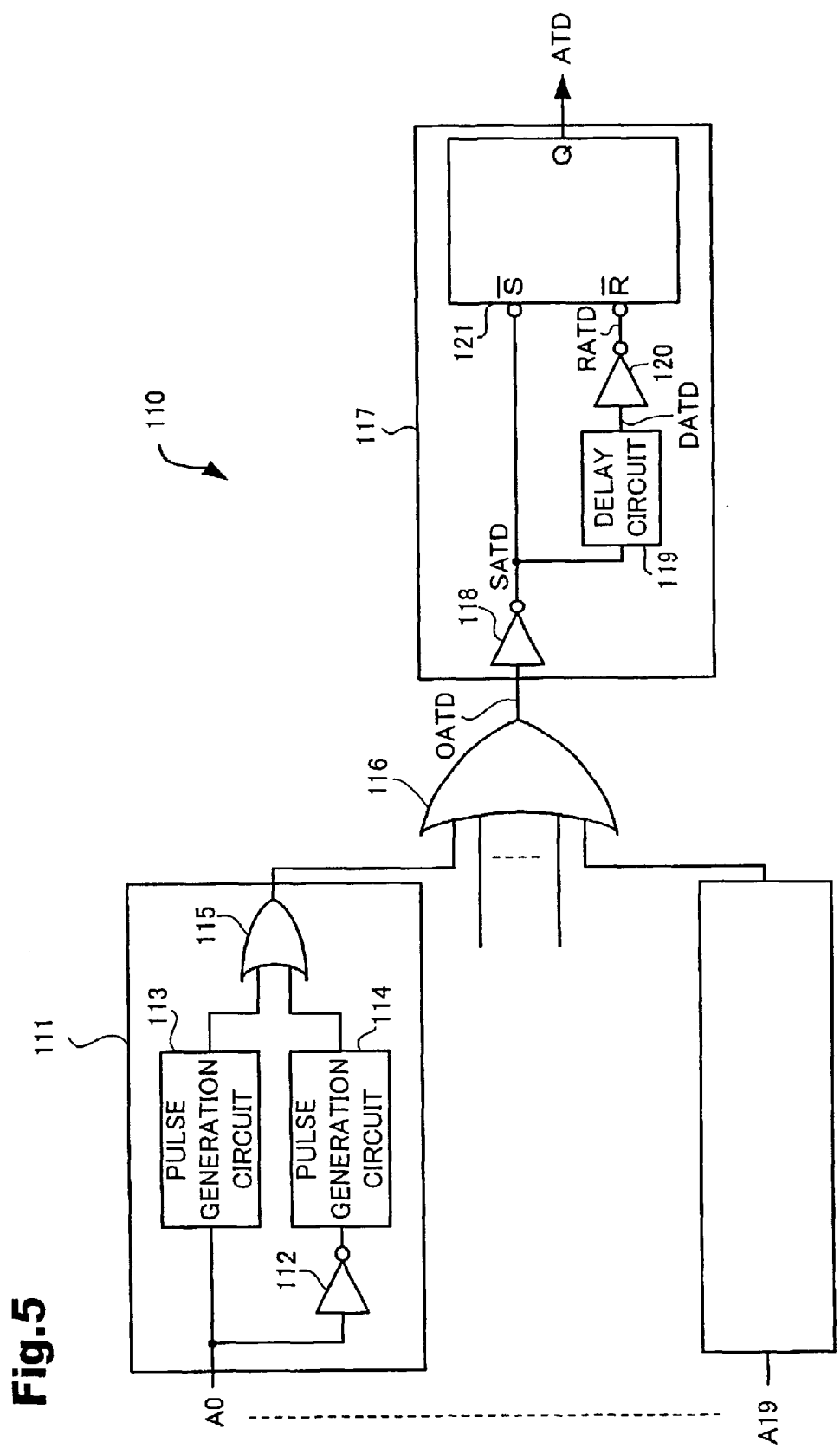
FIG. 5 is a block diagram illustrating the structure of an ATD circuit 110 shown in FIG. 4.

FIG. 5 is a block diagram illustrating the structure of the ATD circuit 110 shown in FIG. 4. The ATD circuit 110 includes 20 transition detection circuits 111, which correspond to the respective bits of the 20-bit address A0 through A19, a 20-input OR gate 116, and an address skew buffer circuit 117 for absorbing an address skew. Each transition detection circuit 111 has an inverter 112, two pulse generation circuits 113 and 114, and an OR gate 115. One shot multi-vibrators, for example, are applicable for the two pulse generation circuits 113 and 114. The address skew buffer circuit 117 has inverters 118 and 120, a delay circuit 119, and an RS latch 121.

Figure 6:
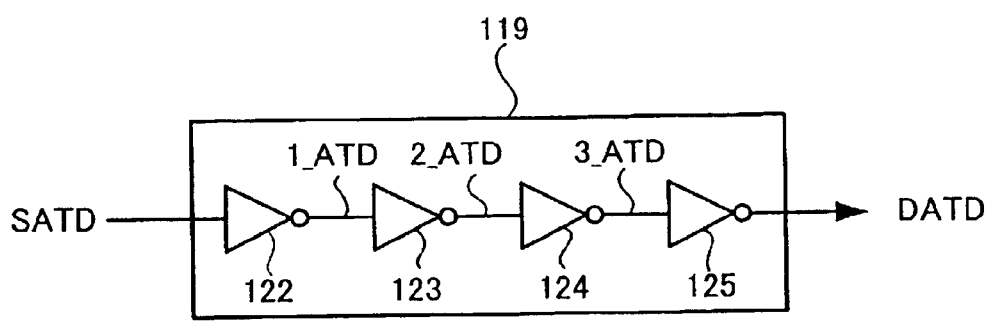
FIG. 6 is a circuit diagram showing the construction of a delay circuit 119 included in an address skew buffer circuit 117 of FIG. 5.

FIG. 6 is a circuit diagram showing the construction of the delay circuit 119 included in the address skew buffer circuit 117 of FIG. 5. As shown in FIG. 6, the delay circuit 119 has four inverters 122 through 125 connected in series. Each of the inverters represents a delay element.

The first pulse generation circuit 113 generates one pulse of a predetermined pulse width at a rising edge of the address bit A0. The inverter 112 and the second pulse generation circuit 114 generate one pulse of a predetermined pulse width at a falling edge of the address bit A0. The OR gate 115 accordingly outputs one pulse at every rising edge and falling edge of the address bit A0. Pulses are generated in a similar manner with regard to the other address bits A1 through A19.

The 20-input OR gate 116 receives outputs of the 20 transition detection circuits 111. In response to a variation in level of the 20-bit address A0 through A19 by at least one bit, the OR gate 116 outputs a pulse-like OATD signal as shown in FIG. 7(a).

FIG. 7 is a timing chart showing variations in level of relevant signals in FIGS. 5 and 6.

In the address skew buffer circuit 117, the inverter 118 inverts the polarity of an OATD signal (FIG. 7(a)) and generates an SATD signal (FIG. 7(b)), which is input into a set terminal of the RS latch 121 and the delay circuit 119. The delay circuit 119 successively delays the SATD signal by means of the four inverters 122 through 125. The SATD signal processed by the delay circuit 119 successively inverts its polarity while maintaining its waveform as shown in FIGS. 7(c) through 7(f), and is delayed by a time td to be a DATD signal. The inverter 120 inverts the polarity of the DATD signal and generates an RATD signal (FIG. 7(g)), which is input into a reset terminal of the RS latch 121. The RS latch 121 accordingly falls into SET state at a fall of the SATD signal and subsequently into RESET state at a fall of the RATD signal. An output terminal Q of the RS latch 121 thus outputs the ATD signal, which rises from the level L to the level H at the fall of the SATD signal and falls from the level H to the level L at the fall of the RATD signal as shown in FIG. 7(h).

The time period of the level H between a rise and a fall of the ATD signal is fixed. The length of the level-H time period is readily specified by appropriately regulating the delay time set in the delay circuit 119. In the structure of this embodiment, the setting of the delay time in the delay circuit 119 makes the eventual level-H time period of the ATD signal equal to a specific length TW, which is not shorter than the allowable address skew range and not longer than a time period between the timing of the rise of the ATD signal, at which the refreshing operation starts, and conclusion of the refreshing operation.

The ATD circuit 110 having the above construction generates the ATD signal having the above setting of the level-H time period.

FIG. 8 is a timing chart showing variations in level of the relevant signals in FIGS. 5 and 6 in the case of occurrence of an address skew.

In the case of the occurrence of an address skew, an OATD signal (FIG. 8(a)) output from the OR gate 116 has two pulses within a short time. In the address skew buffer circuit 117, an SATD signal (FIG. 8(b)) generated by inverting the polarity of the OATD signal is input into the set terminal of the RS latch 121, whereas an RATD signal (FIG. 8(g)) generated by delaying the SATD signal and inverting the polarity of the delayed SATD signal is input into the reset terminal of the RS latch 121. The RS latch 121 accordingly falls into the SET state at a fall of the polarity-inverted first pulse of the SATD signal and subsequently into the RESET state at a fall of the first pulse of the RATD signal. The output terminal Q of the RS latch 121 thus outputs the ATD signal, which rises from the level L to the level H at the fall of the polarity-inverted first pulse of the SATD signal and falls from the level H to the level L at the fall of the first pulse of the RATD signal as shown in FIG. 8(h).

As described above, the level-H time period of the ATD signal is set by the delay circuit 119 to the specific length TW that is not shorter than the allowable address skew range and not longer than a time period between the timing of the rise of the ATD signal, at which the refreshing operation starts, and conclusion of the refreshing operation. Even under the condition of the occurrence of an address skew, the length of the address skew is shorter than the specific length TW set to the time period of the level H. The fall of the polarity-inverted second pulse of the SATD signal shown in FIG. 8(b) is not later than the fall of the first pulse of the RATD signal shown in FIG. 8(g). Namely the polarity-inverted second pulse of the SATD signal input into the set terminal of the RS latch 121 falls while the RS latch 121 is in the SET state. The state of the RS latch 121 is accordingly not changed at the fall of the polarity-inverted second pulse of the SATD signal. Even in the case of the occurrence of an address skew, the ATD signal eventually output from the output terminal Q of the RS latch 121 does not rise to have two pulses within a short time.

The second pulse of the RATD signal input into the reset terminal of the RS latch 121 falls while the RS latch 121 is in the RESET state. The state of the RS latch 121 is thus not changed at the fall of the second pulse of the RATD signal.

The ATD circuit 110 having the above construction does not generate the ATD signal rising to have two pulses within a short time but ensures generation of an appropriate ATD signal even in the case of the occurrence of an address skew.

As described above, in the structure of the embodiment, during the level-H time period of the ATD signal, the ATD signal does not rise to have a new pulse even in the case of the occurrence of an address skew. Setting the level-H time period of the ATD signal to be not shorter than the preset allowable address skew range effectively prevents the ATD signal from rising to have two pulses within a short time and ensures generation of an appropriate ATD signal.

In the structure of the embodiment, the external access starts at the timing of a fall of the ATD signal as described above. Setting the level-H time period of the ATD signal to be not shorter than the preset allowable address skew range extremely lowers the probability of occurrence of an address skew after the start of the external access. This arrangement thus ensures a normal operation of external access without any effects of the occurrence of an address skew.

Counting of the access time generally starts at the time point of the variation in address (that is, at the timing of a rise of the ATD signal). The longer level-H time period of the ATD signal causes a delay in starting time of the external access and thereby lengthens the access time. When a requirement of refresh and a requirement of external access are simultaneously given to an identical memory cell included in the memory cell array, the external access starts after the conclusion of the refreshing operation. The maximum access time is thus not shorter than the access time in such a case, that is, the time period between the time point of the variation in address (the timing of a rise of the ATD signal) and the conclusion of the refreshing operation. In the structure of the embodiment, the level-H time period of the ATD signal is set to be not longer than the time period between the timing of a rise of the ATD signal, at which the refreshing operation starts, and the conclusion of the refreshing operation. The maximum access time is thus within the above range of the access time in the case of the simultaneous requirements of refresh and external access.

Figure 9:
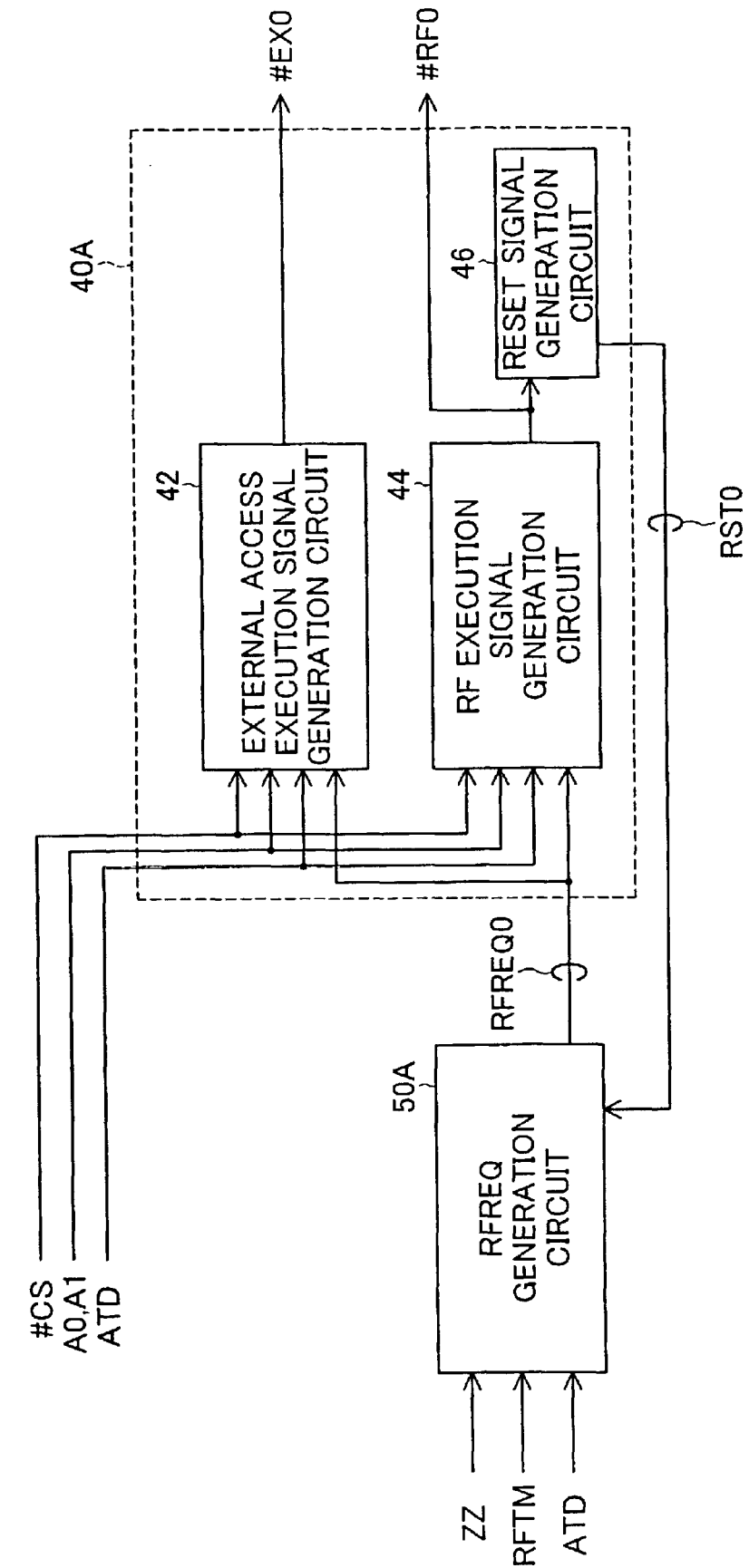
FIG. 9 is a block diagram illustrating the structure of a first block controller 40A shown in FIG. 4.

D. Construction and Operations of Refresh Controller and External Access Controller FIG. 9 is a block diagram illustrating the structure of the first block controller 40A shown in FIG. 4. The other block controllers 40B through 40D have similar structures to that of FIG. 9.

The block controller 40A includes an external access execution signal generation circuit 42 that generates the external access execution signal #EX0, a refresh execution signal generation circuit 44 that generates the refresh execution signal #RF0, and a reset signal generation circuit 46 that generates a reset signal RSTO in response to the refresh execution signal #RF0. The external access execution signal generation circuit 42 receives inputs of the chip select signal #CS, the block address A0 and A1, the ATD signal, and the refresh requirement signal RFREQ0 from the refresh requirement signal generation circuit 50A. The refresh execution signal generation circuit 44 receives inputs of the ATD signal and the refresh requirement signal RFREQ0 from the refresh requirement signal generation circuit 50A.

The refresh requirement signal generation circuit 50A receives inputs of the snooze signal ZZ, the refresh timing signal RFTM, and the ATD signal. When the snooze signal ZZ is at the level L (that is, in the snooze state), the refresh requirement signal generation circuit 50A immediately raises the refresh requirement signal RFREQ0 to the level H at a rising edge of the refresh timing signal RFTM. When the snooze signal ZZ is at the level H (that is, in the operation cycle or in the standby cycle), on the other hand, the refresh requirement signal generation circuit 50A raises the refresh requirement signal RFREQ0 at a rising edge of the ATD signal after the rise of the refresh timing signal RFTM.

When the ATD signal is at the level H and the refresh requirement signal RFREQ0 from the refresh requirement signal generation circuit 50A is at the level H (active), the refresh execution signal generation circuit 44 shown in FIG. 9 receives a requirement for refresh of the first block 20A and sets the refresh execution signal #RF0 to the level L (active). In response to the setting of the refresh execution signal #RF0 at the level L (active), a specific word line specified by the refresh address RFA8 through RFA19 in the block 20A (see FIG. 4) is activated, and the refresh is executed in all the memory cells on the specific word line. When the ATD signal is at the level H but the refresh requirement signal RFREQ0 is at the level L (inactive), the refresh execution signal generation circuit 44 receives no requirement for refresh of the first block 20A and sets the refresh execution signal #RF0 to the level H (inactive).

The reset signal generation circuit 46 shown in FIG. 9 generates the short-pulse reset signal RSTO at a rising edge of the refresh execution signal #RF0. The reset signal generation circuit 46 is, for example, a one shot multivibrator. The refresh requirement signal generation circuit 50A returns the refresh requirement signal RFREQ0 to the level L in response to the reset signal RSTO supplied from the reset signal generation circuit 46. This series of processing cancels the requirement for refresh of the block 20A.

Figure 10:
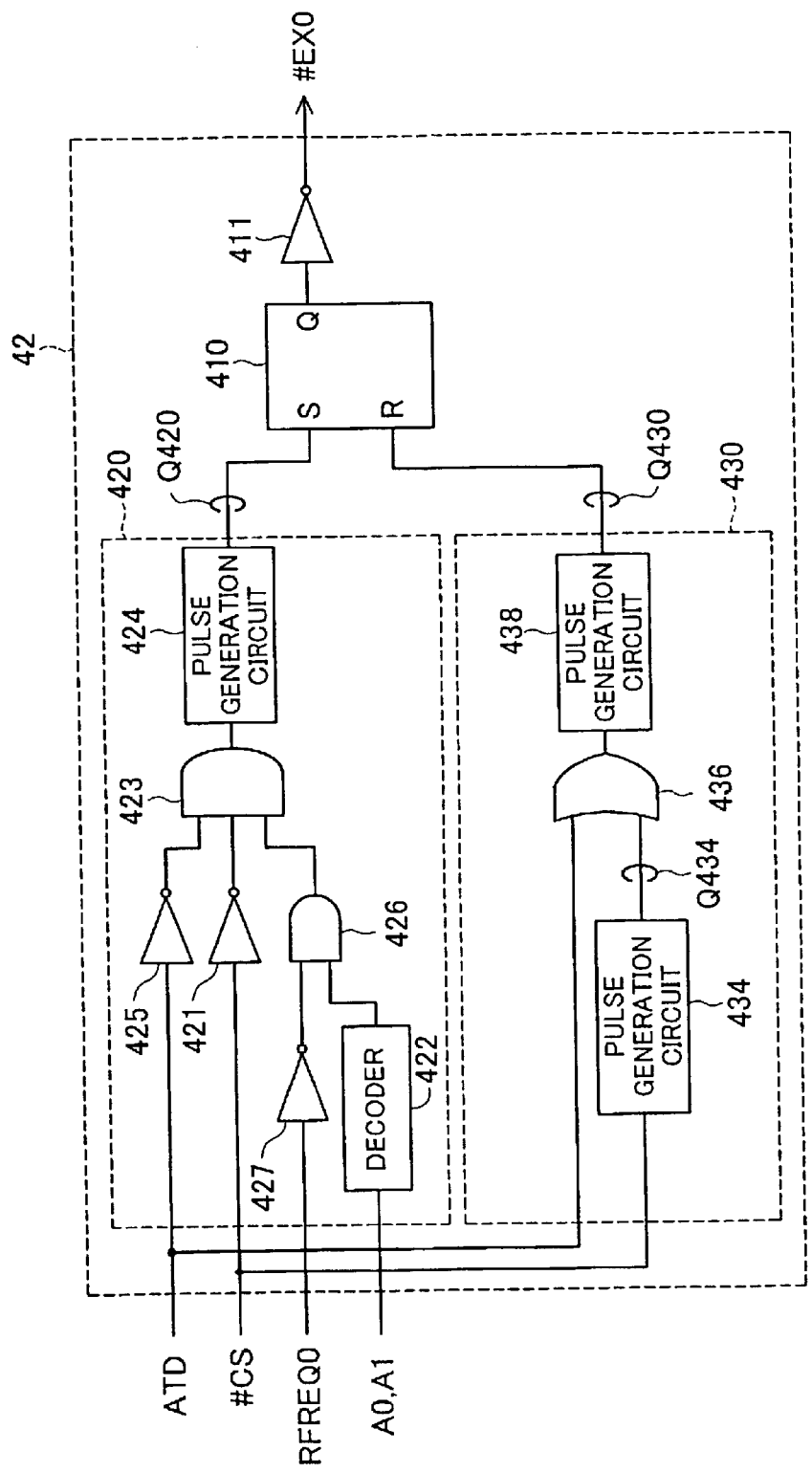
FIG. 10 is a block diagram illustrating the construction of an external access execution signal generation circuit 42 shown in FIG. 9.

FIG. 10 is a block diagram illustrating the construction of the external access execution signal generation circuit 42 shown in FIG. 9. The external access execution signal generation circuit 42 includes an RS latch 410, an inverter 411, a set signal generation circuit 420, and a reset signal generation circuit 430. An output signal Q420 from the set signal generation circuit 420 is input into a set terminal S of the RS latch 410. An output signal Q430 from the reset signal generation circuit 430 is input into a reset terminal R of the RS latch 410.

The set signal generation circuit 420 includes inverters 421, 425, and 429, a decoder 422, a 3-input AND gate 423, a pulse generation circuit 424, and an AND gate 426. The decoder 422 sets its output to the level H when the value of the given block address A0 and A1 is equal to '0' representing the first block 20A, while otherwise setting its output to the level L. The AND gate 426 receives the polarity-inverted refresh requirement signal RFREQ0 via the inverter 427 and the output signal of the decoder 422. The output of the AND gate 426 is given to the 3-input AND gate 423. The 3-input AND gate 423 receives inputs of the output signal from the AND gate 426, the polarity-inverted ATD signal via the inverter 425, and the polarity-inverted chip select signal #CS via the inverter 421. The output of the AND gate 423 is given to the pulse generation circuit 424.

The set signal generation circuit 420 basically sets the external access execution signal #EX0 at the level L (active) at the timing of a fall of the ATD signal, when a requirement of external access is given to the first block 20A related to the first block controller 40A. When the chip select signal #CS is at the level L (active) and the value of the block address A0 and A1 is equal to '0', the set signal generation circuit 420 determines that external access to the block 20A is required and supplies the pulse signal Q420 to the set terminal S of the RS latch 410 at the timing of a fall of the ATD signal.

The RS latch 410 and the inverter 411 set the external access execution signal #EX0 at the level L (active) in response to the pulse signal Q420. When the external access execution signal #EX0 is at the level L (active), a specific word line specified by the row address A8 through A19 in the block 20A (see FIG. 4) is activated for execution of external access.

The reset signal generation circuit 430 includes two pulse generation circuits 434 and 438 and a 2-input OR gate 436. The first pulse generation circuit 434 generates a pulse at a rising edge of the chip select signal #CS. The 2-input OR gate 436 receives inputs of the ATD signal and the output signal of the first pulse generation circuit 434. The output of the OR gate 436 is given to the second pulse generation circuit 438.

The reset signal generation circuit 430 thus supplies the pulse signal Q430 to the reset terminal R of the RS latch 410 in response to a rise of the ATD signal to the level H or in response to a rise of the chip select signal #CS to the level H (inactive). The RS latch 410 and the inverter 411 set the external access execution signal #EX0 at the level H (inactive) in response to the pulse signal Q430.

As described above, the level-H time period of the ATD signal (that is, the pulse width of the ATD signal) is set equal to the specific length TW that is not longer than the time period between the timing of a rise of the ATD signal, at which the refreshing operation starts, and the conclusion of the refreshing operation, for example, a time period RW of the level H of the refresh requirement signal RFREQ0 shown in FIG. 12(k). The ATD signal accordingly falls simultaneously with a fall of the refresh requirement signal RFREQ0 or at an earlier timing.

When both a requirement of external access and a requirement of refresh are given to the identical block 20A related to the first block controller 40A, the external access execution signal #EX0 is set at the level L (active), not based on the timing of a fall of the ATD signal but based on the timing of a fall of the refresh requirement signal RFREQ0. The set signal generation circuit 420 determines that external access and refresh are required to the block 20A, when the chip select signal #CS is at the level L (active), the value of the block address A0 and A1 is equal to '0', and the refresh requirement signal RFREQ0 is at the level H (active). The pulse signal Q420 is supplied to the set terminal S of the RS latch 410, not based on the timing of a fall of the ATD signal but based on the timing of a fall of the refresh requirement signal RFREQ0.

When both a requirement of external access and a requirement of refresh are given to the identical block 20A, the external access execution signal #EX0 is kept at the level H (inactive) even after a fall of the ATD signal to the level L until the refresh of the block 20A is concluded. The external access execution signal #EX0 is set at the level L (active) after conclusion of the refresh and a fall of the refresh requirement signal RFREQ0 to the level L (inactive). Setting the external access execution signal #EX0 at the level L (active) starts the operation for external access to the block 20A.

The external access execution signal #EX0 and the refresh execution signal #RF0 output from the block controller 40A (FIG. 9) are supplied to the row pre-decoder 30A included in the block 20A (FIG. 4).

Figure 11:
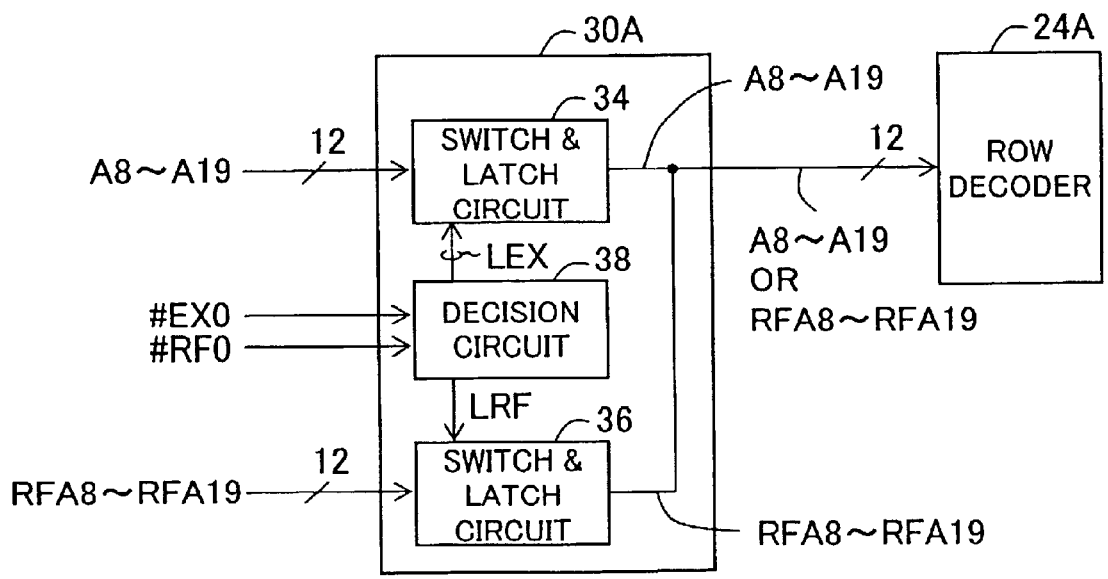
FIG. 11 is a block diagram illustrating the structure of a first row pre-decoder 30A.

FIG. 11 is a block diagram illustrating the structure of the first row pre-decoder 30A shown in FIG. 4. The row pre-decoder 30A includes two switch & latch circuits 34 and 36 and a decision circuit 38. The other row pre-decoders 30B through 30D have similar structures to that of FIG. 11.

The decision circuit 38 receives the external access execution signal #EX0 and the refresh execution signal #RF0 transmitted from the block controller 40A. The decision circuit 38 supplies a control signal LEX corresponding to the external access execution signal #EX0 to the first switch & latch circuit 34, while supplying a control signal LRF corresponding to the refresh execution signal #RF0 to the second switch & latch circuit 36.

When the external access execution signal #EX0 is at the level L (active), the first switch & latch circuit 34 latches the row address A8 through A19 given from the external device in response to the control signal LEX and supplies the latched row address A8 through A19 to the row decoder 24A included in the first block 20A. In this case, the second switch & latch circuit 36 prohibits its output in response to the control signal LRF.

When the refresh execution signal #RF0 is at the level L (active), on the other hand, the second switch & latch circuit 36 latches the refresh address RFA8 through RFA19 given from the refresh counter 100 (FIG. 4) in response to the control signal LRF and supplies the latched refresh address RFA8 through RFA9 to the row decoder 24A. In this case, the first switch & latch circuit 34 prohibits its output in response to the control signal LEX.

The block controller 40A (FIG. 9) is designed not to simultaneously set the two execution signals #EX0 and #RF0 at the level L (active). When the two execution signals #EX0 and #RF0 are both at the level H (inactive), the row pre-decoder 30A supplies neither the row address A8 through A19 nor the refresh address RFA8 through RFA19 to the row decoder 24A.

The row pre-decoder 30A selects one of the row address A8 through A19 and the refresh address RFA8 through RFA19 according to the levels of the two execution signals #EX0 and #RF0 and supplies the selected address to the row decoder 24A included in the block 20A (FIG. 4). The row decoder 24A activates one word line in the block 20A selected by the row address A8 through A19 or the refresh address RFA8 through RFA19 supplied from the row pre-decoder 30A.

E. Operations for External Access and Refresh in Response to ATD Signal

The following concretely describes how the external access and the refresh are performed in response to the ATD signal appropriately generated as discussed above in the operation cycle.

Figure 12:
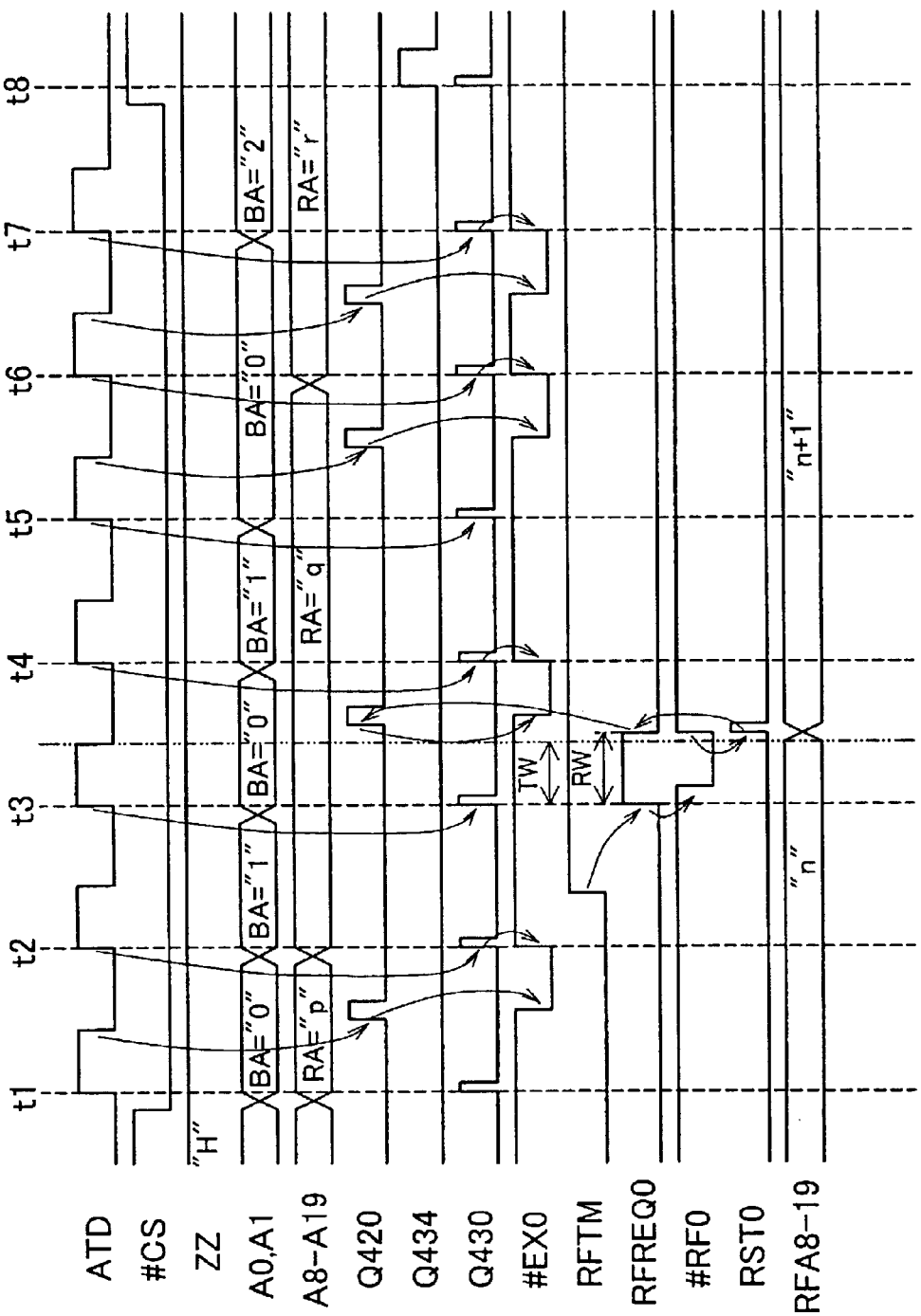
FIGS. 12(a)–(n) are timing charts showing the operations of the first block controller 40A in response to a requirement of refresh in operation cycles.

FIG. 12 is a timing chart showing the operations of the first block controller 40A (FIG. 9) in response to a requirement of refresh in the operation cycles. In the operation cycles, the chip select signal #CS (FIG. 12(b)) is at the level L (active) and the snooze signal ZZ (FIG. 12(c)) is at the level H. The ATD signal (FIG. 12(a)) has rising edges at time points t1 through t7, and there are seven consecutive operation cycles starting from the respective time points. A requirement of refresh is given in the course of the seven consecutive operation cycles.

In the first operation cycle starting from the time point t1, the value of the block address A0 and A1 (FIG. 12(d)) is equal to '0', and there is a requirement of external access to the first block 20A. In this operation cycle, no requirement of refresh has been given yet, and the refresh timing signal RFTM (FIG. 12(j)) supplied to the refresh requirement signal generation circuit 50A of FIG. 9 is kept at the level L. The refresh requirement signal RFREQ0 (FIG. 12(k)), which is supplied to the external access execution signal generation circuit 42 and the refresh execution signal generation circuit 44 in the first block controller 40A, is also kept at the level L.

The set signal generation circuit 420 shown in FIG. 10 outputs the pulse signal Q420 (FIG. 12(f)), based on the timing of a fall of the ATD signal. The RS latch 410 and the inverter 411 set the external access execution signal #EX0 (FIG. 12(i)) at the level L (active) in response to the pulse signal Q420.

The refresh execution signal #RF0 (FIG. 12(l)) output from the refresh execution signal generation circuit 44 of FIG. 9 is kept at the level H (inactive), whereas the reset signal RST0 (FIG. 12(m)) output from the reset signal generation circuit 46 is kept at the level L.

In the second operation cycle starting from the time point t2, the value of the block address A0 and A1 is changed from '0' to '1', and the value of the row address A8 through A19 (FIG. 12(e)) is changed from 'p' to 'q'. The ATD signal accordingly rises from the level L to the level H in response to this address variation. The reset signal generation circuit 430 shown in FIG. 10 outputs the pulse signal Q430 (FIG. 12(h)) at the timing of a rise of the ATD signal. The RS latch 410 and the inverter 411 sets the external access execution signal #EX0 at the level H (inactive) in response to the pulse signal Q430.

As mentioned above, the value of the block address A0 and A1 is equal to '1', which represents the second block 20B. There is accordingly no requirement of external access to the first block 20A. The set signal generation circuit 420 shown in FIG. 10 thus does not output the pulse signal Q420 at the timing of a subsequent fall of the ATD signal. The RS latch 410 and the inverter 411 keep the external access execution signal #EX0 (FIG. 12(i)) at the level H (inactive).

The refresh timing signal RFTM rises to the level H in the second operation cycle as shown in FIG. 12(j). The refresh requirement signal generation circuit 50A (FIG. 9) sets the refresh requirement signal RFREQ0 (FIG. 12(k)) at the level H synchronously with a next rising edge of the ATD signal (FIG. 12(A)) (at the time point t3), and gives a requirement of refresh to the first block 20A. As described above, the refresh requirement signal RFREQ0 is kept at the level H until conclusion of the refresh of the first block 20A.

In the third operation cycle starting from the time point t3, the refresh requirement signal RFREQ0 is set at the level H as mentioned above. The refresh of the first block 20A is thus demanded. The value of the block address A0 and A1 is equal to '0' and there is a requirement of external access to the first block 20A. Under such conditions, the refresh execution signal generation circuit 44 shown in FIG. 9 sets the refresh execution signal #RF0 (FIG. 12(l)) at the level L (active) in response to the refresh requirement signal RFREQ0 and the ATD signal. The refresh of the first block 20A is then performed prior to the external access to the first block 20A.

The first row pre-decoder 30A shown in FIG. 11 selects the refresh address RFA8 through RFA19 and supplies the selected refresh address RFA8 through RFA19 to the first row decoder 24A. In the first block 20A, an 'n-th' word line selected by the refresh address RFA8 through RFA19 (FIG. 12(n)) is activated, and all the memory cells on the n-th word line are subjected to the refreshing operation.

In the third operation cycle, when a sufficient time period for the refreshing operation elapses, the refresh execution signal generation circuit 44 raises the refresh execution signal #RF0 to the level H (inactive). The reset signal generation circuit 46 generates the short-pulse reset signal RST0 (FIG. 12(m)) at a rising edge of the refresh execution signal #RF0. The refresh requirement signal generation circuit 50A (FIG. 9) returns the refresh requirement signal RFREQ0 to the level L in response to the reset signal RST0. This series of processing completes the refresh of the first block 20A.

As described above, in the third operation cycle, the value of the block address A0 and A1 is equal to '0' and a requirement of external access is given to the first block 20A. The set signal generation circuit 420 shown in FIG. 10 waits for conclusion of the refresh of the first block 20A and outputs the pulse signal Q420 (FIG. 12(f)) at the timing of a fall of the refresh requirement signal RFREQ0 (FIG. 12(k)). The RS latch 410 and the inverter 411 set the external access execution signal #EX0 (FIG. 12(i)) at the level L (active) in response to the pulse signal Q420.

In the fourth operation cycle starting from the time point t4, the value of the block address A0 and A1 is changed from '0' to '1'. The reset signal generation circuit 430 shown in FIG. 10 accordingly outputs the pulse signal Q430 (FIG. 12(h)) at the timing of a rise of the ATD signal, as in the second operation cycle. The RS latch 410 and the inverter 411 set the external access execution signal #EX0 at the level H (inactive) in response to the pulse signal Q430.

The value of the block address A0 and A1 is equal to '1', which represents the second block 20B. There is no requirement of external access to the first block 20A. As in the second operation cycle, the set signal generation circuit 420 shown in FIG. 10 does not output the pulse signal Q420 (FIG. 12(f)) at the timing of a subsequent fall of the ATD signal. The RS latch 410 and the inverter 411 keep the external access execution signal #EX0 (FIG. 12(i)) at the level H (inactive).

In the fifth operation cycle starting from the time point t5, the value of the block address A0 and A1 is changed to '0', and there is a requirement of external access to the first block 20A. As in the first and the third operation cycles, the set signal generation circuit 420 shown in FIG. 10 outputs the pulse signal Q420 (FIG. 12(f)) at the timing of a fall of the ATD signal. The RS latch 410 and the inverter 411 set the external access execution signal #EX0 (FIG. 12(i)) at the level L (active) in response to the pulse signal Q420.

In the sixth operation cycle starting from the time point t6, the value of the block address A0 and A1 is kept equal to '0', while the value of the row address A8 through A19 is changed from 'q' to 'r'. As in the second and the fourth operation cycles, the reset signal generation circuit 430 shown in FIG. 10 outputs the pulse signal Q430 (FIG. 12(h)) at the timing of a rise of the ATD signal. The RS latch 410 and the inverter 411 set the external access execution signal #EX0 at the level H (inactive) in response to the pulse signal Q430.

In this state, the value of the block address A0 and A1 is kept equal to '0', and there is no requirement of external access to the first block 20A. The set signal generation circuit 420 shown in FIG. 10 subsequently outputs the pulse signal Q420 (FIG. 12(f)) at the timing of a fall of the ATD signal. The RS latch 410 and the inverter 411 again set the external access execution signal #EX0 (FIG. 12(i)) at the level L (active) in response to the pulse signal Q420.

In the seventh operation cycle starting from the time point t7, the value of the block address A0 and A1 is changed from '0' to '2'. As in the second, the fourth, and the sixth operation cycles, the reset signal generation circuit 430 shown in FIG. 10 outputs the pulse signal Q430 (FIG. 12(h)) at the timing of a rise of the ATD signal. The RS latch 410 and the inverter 411 set the external access execution signal #EX0 at the level H (inactive) in response to the pulse signal Q430.

In this state, the value of the block address A0 and A1 is changed to '2', which represents the third block 20C, and there is no requirement of external access to the first block 20A. As in the second and the fourth operation cycles, the set signal generation circuit 420 shown in FIG. 10 does not output the pulse signal Q420 (FIG. 12(f)) at the timing of a subsequent fall of the ATD signal. The RS latch 410 and the inverter 411 keep the external access execution signal #EX0 (FIG. 12(i)) at the level H (inactive).

Before a time point t8, the chip select signal #CS has risen to the level H (inactive). At the time point t8, the first pulse generation circuit 434 included in the reset signal generation circuit 430 of FIG. 10 outputs the pulse signal Q434 (FIG. 12(g)), and the reset signal generation circuit 430 outputs the pulse signal Q430. The RS latch 410 is in the RESET state at this moment. The state of the RS latch 410 is not changed by the input of the pulse signal Q430. The external access execution signal #EX0 (FIG. 12(i)) is accordingly kept at the level H (inactive).

Figure 13:
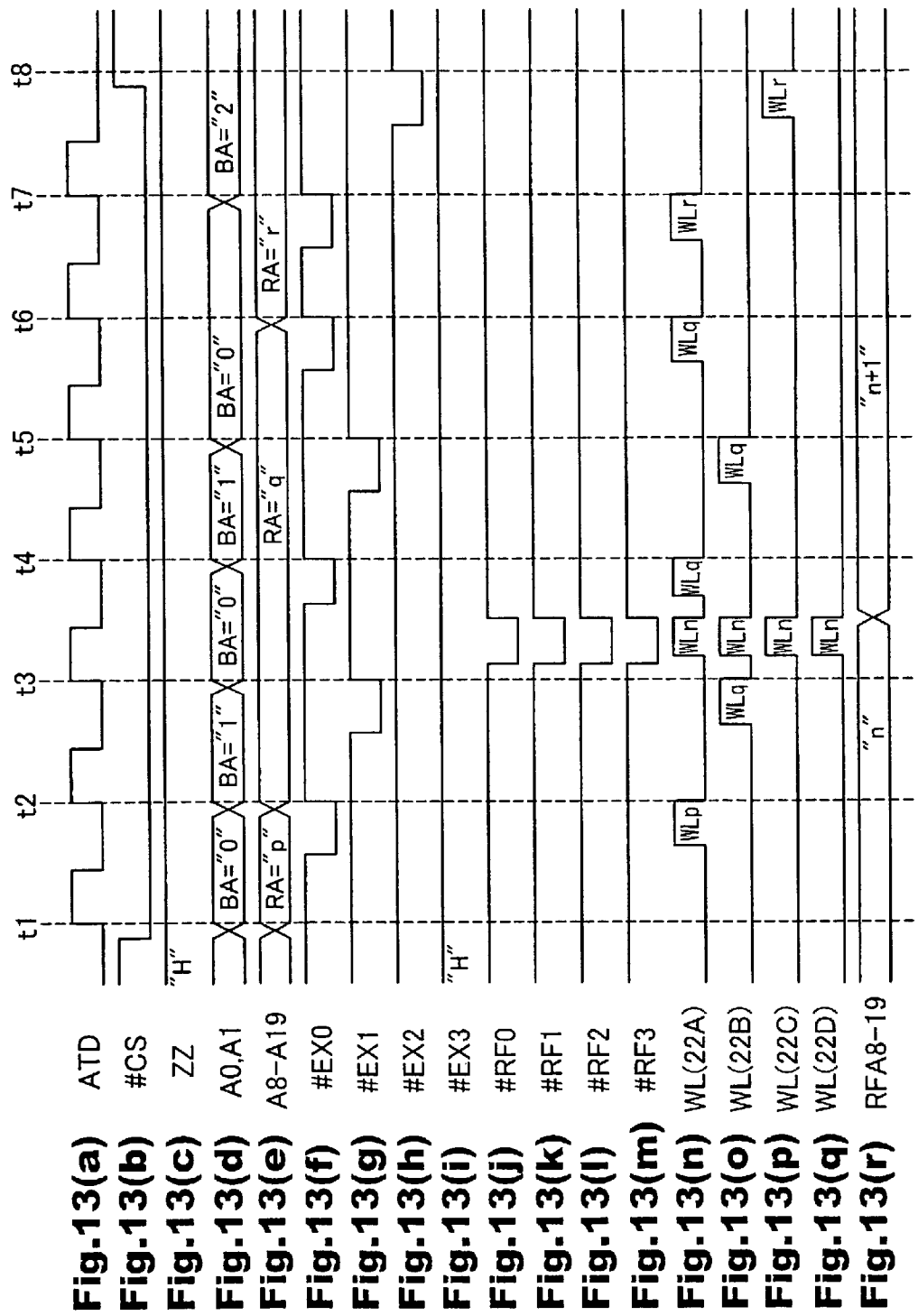
FIGS. 13(a)–(r) are timing charts showing the operations of respective block controllers 40A through 40D and the status of word lines in the operation cycles shown in FIG. 12.

FIG. 13 is a timing chart showing the operations of the respective block controllers 40A through 40D and the status of word lines in the operation cycles shown in FIG. 12. FIGS. 13(a) through (e) and 13(r) are equal to FIGS. 12(a) through (e) and 12(n). The signals #EX0 (FIG. 13(f)) and RFREQ0 (FIG. 13(j)) related to the first block controller 40A correspond to FIGS. 12(i) and 12(k). FIGS. 13(g) through 13(i) show the external access execution signals #EX1 through #EX3 output from the respective block controllers 40B through 40D. FIGS. 13(k) through 13(m) show the refresh execution signals #RF1 through #RF3 output from the respective block controllers 40B through 40D. FIGS. 13(n) through 13(q) show the status of word lines WL in the sub-arrays 22A through 22D of the respective blocks 20A through 20D (see FIG. 4). Each sub-array includes multiple word lines, but any two or plural word lines are simultaneously activated in one sub-array. For example, different word lines successively activated in the sub-array 22A are shown on an identical timing chart of FIG. 13(n). Word lines WLp, WL, WLq, and WLr risen to the level H represent different word lines successively activated.

In the first operation cycle, there is a requirement of external access to the first block 20A (FIG. 13(d)). Only the first external access execution signal #EX0 is accordingly set at the level L (active), and external access to a memory cell in the first sub-array 22A is carried out as shown in FIGS. 13(f) through 13(i). In the first operation cycle, only a 'p'-th word line WLp selected by the row address A8 through A19 (FIG. 13(e)) is activated in the first sub-array 22A, whereas no word line is activated in the other sub-arrays 22B through 22D as shown in FIGS. 13(n) through 13(q).

In the second operation cycle, the value of the block address A0 and A1 is changed to '1', which represents the second block 20B (FIG. 13(d)), and there is a requirement of external access to the second block 20B. The second block controller 40B accordingly sets the second external access execution signal #EX1 (FIG. 13(g)) at the level L (active) at the timing of a fall of the ATD signal. External access to a memory cell in the second sub-array 22B is thus carried out. In the second operation cycle, only a 'q'-th word line WLq selected by the row address A8 through A19 (FIG. 13(e)) is activated in the second-sub-array 22B, whereas the 'p'-th word line WLp in the first sub-array 22A is inactivated as shown in FIGS. 13(n) through 13(q).

As described above, the refresh timing signal RFTM (FIG. 12(j)) rises to the level H in the second operation cycle. In the third operation cycle, the refresh requirement signal RFREQ0 (FIG. 12(k)) as well as all the other refresh requirement signals RFREQ1 through RFREQ3 are set at the level H, and a requirement of refresh is given to the respective blocks 20A through 20D.

In the third operation cycle, refresh is carried out first in all the blocks 20A through 20D, regardless of the requirement of external access. All the refresh execution signals #RF0 through #RF3 (FIGS. 13(j) through 13(m)) are accordingly set first at the level L (active) in the third operation cycle, while all the external access execution signals #EX0 through #EX3 (FIGS. 13(f) through 13(i)) are set at the level H (inactive). An 'n'-th word line WLn selected by the refresh address RFA8 through RFA19 (FIG. 13(r)) is then activated in all the sub-arrays 22A through 22D in the third operation cycle (FIGS. 13(n) through 13(q)). All the memory cells on the activated word lines WLn are subjected to the refreshing operation. When the refresh execution signals #RF0 through #RF3 subsequently rise to the level H, the refresh requirement signal RFREQ0 (FIG. 12(k)) as well as all the other refresh requirement signals RFREQ1 through RFREQ3 are returned to the level L. This concludes the refreshing operation of all the blocks 20A through 20D. The refresh counter controller 90 shown in FIG. 4 generates the count up signal #CNTUP in response to the return of all the refresh requirement signals RFREQ0 through RFREQ3 to the level L.

In the third operation cycle, on conclusion of the refreshing operation with regard to all the blocks 20A through 20D, only the external access execution signal #EX0 (FIG. 13(f)) corresponding to the first block 20A, to which the requirement of external access has been given, is set at the level L (active). This starts the external access to the first block 20A. In the third operation cycle, after the 'n'-th word line WLn is inactivated in all the sub-arrays 22A through 22D, only the 'q'-the word line WLq selected by the row address A8 through A19 (FIG. 13(e)) is activated in the first sub-array 22A while no word line is activated in the other sub-arrays 22B through 22D.

As in the second operation cycle, the value of the block address A0 and A1 (FIG. 13(d)) is changed to '1', which represents the second block 20B, in the fourth operation cycle. There is accordingly a requirement of external access to the second block 20B. As shown in FIGS. 13(f) through 13(i), only the second external access execution signal #EX1 is set at the level L (active), and external access to a memory cell in the second sub-array 22B is carried out. In the fourth operation cycle, the 'q'-the word line WLq in the first sub-array 22A is inactivated while only the 'q'-the word line WLq in the second sub-array 22B is activated as shown in FIGS. 13(n) through 13(q).

In the fifth and the sixth operation cycles, as in the first operation cycle, there is a requirement of external access to the first block 20A (FIG. 13(d)). Only the first external access execution signal #EX0 is accordingly set at the level L (active) and external access to a memory cell in the first sub-array 22A is carried out as shown in FIGS. 13(f) through 13(i). In the fifth operation cycle, the 'q'-th word line WLq in the second sub-array 22B is inactivated while only the 'q'-th word line WLq in the first sub-array 22A is activated as shown in FIGS. 13(n) through 13(q). In the sixth operation cycle, after the 'q'-th word line WLq in the first sub-array 22A is inactivated, only an 'r'-th word line WLr selected by the row address A8 through A19 (FIG. 13(e)) is activated in the same first sub-array 22A.

In the seventh operation cycle, the value of the block address A0 and A1 (FIG. 13(d)) is changed to '2', which represents the third block 20C. This means that there is a requirement of external access to the third block 20C. The third block controller 40C then sets the external access execution signal #EX2 (FIG. 13(h)) at the level L (active) to allow external access to a memory cell in the third sub-array 22C. In the seventh operation cycle, the 'r'-th word line WLr in the first sub-array 22A is inactivated while only the 'r'-th word line WLr in the third sub-array 22C is activated as shown in FIGS. 13(n) through 13(q).

As described above, in the arrangement of this embodiment, the operation of external access basically starts in response to a requirement of external access at the timing of a fall of the ATD signal. In response to a requirement of refresh, on the other hand, the refreshing operation starts simultaneously in all the blocks at the timing of a rise of the ATD signal, regardless of the requirement of external access. On conclusion of the refreshing operation, the arrangement starts external access only to the block, which is the target of the requirement of external access. In this manner, the operations of external access and refresh are carried out based on the appropriately generated ATD signal.

F. Another Embodiment

In the structure of the embodiment discussed above, the time period of the level H between a rise and a fall of the ATD signal (that is, the pulse width of the ATD signal) is set to be not shorter than the preset allowable address skew range and to be not longer than the time period between the timing of a rise of the ATD signal, at which the refreshing operation starts, and conclusion of the refreshing operation. In order to prevent the access time from being lengthened unnecessarily, the end of the level-H time period of the ATD signal (that is, the fall of the ATD signal) is set to be simultaneous with or prior to conclusion of the refreshing operation.

In the case of occurrence of an address skew, the end of the level-H time period of the ATD signal may be extended according to the occurrence of the address skew. This arrangement is discussed below as another embodiment.

In the structure of this embodiment, the level-H time period of the ATD signal is basically set equal to a specific length, which is not shorter than the preset allowable address skew range, like the above embodiment. When there is a variation in address due to the occurrence of an address skew during the time period of the level H, the level-H time period is extended and is kept for a predetermined time period since the variation in address.

The following describes how the ATD circuit 110 generates the ATD signal having the extended time period of the level H with the occurrence of the address skew.

The ATD circuit 110 of this embodiment has a similar structure to that of FIG. 5, except that a delay circuit 119' replaces the delay circuit 119 in the address skew buffer circuit 117 shown in FIG. 6.

Figure 14:
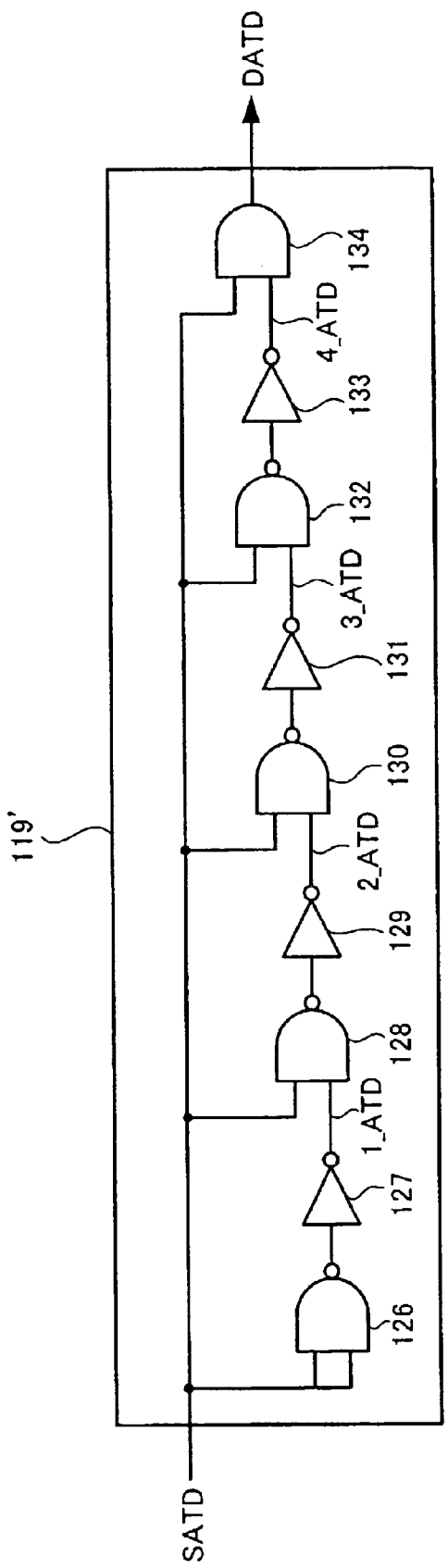
FIG. 14 is a circuit diagram showing the structure of a delay circuit in an address skew buffer circuit used for a semiconductor memory device as another embodiment of the present invention.

FIG. 14 is a circuit diagram showing the structure of a delay circuit 119' in the address skew buffer circuit 117 used for a semiconductor memory device as another embodiment of the present invention. As shown in FIG. 14, the delay circuit 119' includes four pairs of an NAND gate and an inverter (126 & 127, 128 & 129, 130 & 131, 132 & 133), which are connected in series, and a last-staged AND gate 134. The respective inverters function as delay elements.

FIG. 15 is a timing chart showing variations in level of relevant signals in FIGS. 5 and 14.

In response to output of a pulse-like OATD signal (FIG. 15(a)) from the OR gate 116 of FIG. 5 with a variation in address, the inverter 118 in the address skew buffer circuit 117 inverts the polarity of the OATD signal and generates an SATD signal (FIG. 15(b)), which is input into the set terminal of the RS latch 121 and the delay circuit 119'. In the delay circuit 119', the SATD signal is delayed by the first pair of the NAND gate 126 and the inverter 127 to generate a 1_ATD signal (FIG. 15(c)). The rising edge of the 1_ATD signal is successively delayed by the second through the fourth pairs of the NAND gate and the inverter (128 & 129, 130 & 131, 132 & 133) as shown in FIGS. 15(c) through 15(f) to extend the time period of the level L. A resulting 4_ATD signal and the SATD signal are input into the AND gate 134, which computes a logical product of the 4_ATD signal and the SATD signal and generates a DATD signal (FIG. 15(g)).

The delay circuit 119' delays the rising edge of the SATD signal in this manner and outputs the DATD signal having the extended time period of the level L. The inverter 120 of FIG. 5 inverts the polarity of this DATD signal and generates an RATD signal (FIG. 15(h)), which is input into the reset terminal of the RS latch 121. The RS latch 121 accordingly falls into the SET state at a fall of the SATD signal and subsequently into the RESET state at a fall of the RATD signal. The output terminal Q of the RS latch 121 thus outputs the ATD signal, which rises from the level L to the level H at the fall of the SATD signal and falls from the level H to the level L at the fall of the RATD signal as shown in FIG. 15(i).

The time period of the level H between a rise and a fall of the ATD signal is basically fixed. The length of the level-H time period is readily specified by appropriately regulating the delay time set in the delay circuit 119'.

As described above, the setting of the delay time in the delay circuit 119' makes the eventual level-H time period of the ATD signal equal to a specific length TW, which is not shorter than the allowable address skew range.

FIG. 16 is a timing chart showing variations in level of the relevant signals in FIGS. 5 and 14 in the case of occurrence of an address skew;.

In the case of the occurrence of an address skew, an OATD signal (FIG. 16(a)) output from the OR gate 116 has two pulses within a short time. The inverter 118 in the address skew buffer circuit 117 inverts the polarity of this OATD signal and generates an SATD signal (FIG. 16(b)), which is input into the set terminal of the RS latch 121 and the delay circuit 119'. The SATD signal having the polarity-inverted two pulses is delayed by the first pair of the NAND gate 126 and the inverter 127 in the delay circuit 119' and is output as a 1_ATD signal (FIG. 16(c)) as discussed above. A rising edge of the polarity-inverted first pulse and a rising edge of the polarity-inverted second pulse of the 1_ATD signal having the polarity-inverted two pulses are successively delayed by the second through the fourth pairs of the NAND gate and the inverter (128 & 129, 130 & 131, 132 & 133) as shown in FIGS. 16(c) through 16(f). This extends the time period of the level L of the respective pulses. The AND gate 134 computes a logical product of a resulting 4_ATD signal having the two pulses of the extended level-L time period and the SATD signal having the polarity-inverted two pulses and generates a DATD signal (FIG. 16(g)), which is a signal having one merged, polarity-inverted pulse of a long level-L time period. Inversion of the polarity of this DATD signal gives an RATD signal (FIG. 16(h)) having a long level-H time period. The RATD signal is input into the reset terminal of the RS latch 121. The RS latch 121 accordingly falls into the SET state at a fall of the polarity-inverted first pulse of the SATD signal and subsequently into the RESET state at a fall of the RATD signal. The output terminal Q of the RS latch 121 thus outputs the ATD signal of a long level-H time period, which rises from the level L to the level H at the fall of the polarity-inverted first pulse of the SATD signal and falls from the level H to the level L at the fall of the RATD signal as shown in FIG. 16(i).

In the case where the OATD signal has two pulses within a short time due to the occurrence of an address skew, the delay circuit 119' functions to successively delay the rear edges of the respective pulses (the rising edges of the 1_ATD signal through 4_ATD signal) and eventually generate the RATD signal having one merged pulse of a large pulse width. The RATD signal is used as the reset signal of the RS latch 121. In response to the occurrence of an address skew, the level-H time period of the ATD signal rising to the level H at a fall of the polarity-inverted first pulse of the SATD signal exceeds the specific length TW and is extended to the fall of the RATD signal. When the second pulse of the OATD signal (FIG. 16(a)) rises with a variation in address due to the occurrence of an address skew, the level-H time period of the ATD signal is extended and is kept for at least the specific length TW since the rise of the second pulse.

In the arrangement of the embodiment, after the extension of the level-H time period of the ATD signal due to the occurrence of an address skew, when another address skew occurs during the extended level-H time period, the level-H time period of the ATD signal is extended again.

FIG. 17 is a timing chart showing variations in level of the relevant signals in FIGS. 5 and 14 in the case of successive occurrence of address skews.

In response to the occurrence of an address skew, an OATD signal (FIG. 17(a)) rises to have a second pulse after the rise of a first pulse. The level-H time period of the ATD signal (FIG. 17(i)) is then extended and is kept by the specific length TW since the rise of the second pulse. When the OATD signal rises again to have a third pulse in response to the occurrence of another address skew during the extended level-H time period of the ATD signal, the level-H time period of the ATD signal (FIG. 17(i)) is further extended and is kept by the specific length TW since the rise of the third pulse.

In the case of the successive occurrence of address skews, the level-H time period of the ATD signal is successively extended.

The refresh controller and the external access controller of this embodiment have the same construction as that of the first embodiment and are thus not specifically described here. The operations of external access and refresh based on the ATD signal generated in the above manner are readily estimated from the description of the first embodiment and are thus not specifically described here.

As described above, in the case of the occurrence of an address skew, the arrangement of the embodiment automatically extends the level-H time period of the ATD signal, thus effectively preventing the ATD signal from rising plural times to have multiple pulses within a short time and ensuring generation of an appropriate ATD signal.

The operation of external access starts at the timing of a fall of the ATD signal. This arrangement extremely lowers the probability of occurrence of an address skew after the start of the external access, and thus ensures a normal operation of external access without any effects of the occurrence of an address skew.

During the occurrence of an address skew, the address is not fixed. Even when the level-H time period of the ATD signal is extended in response to the occurrence of an address skew and the starting time of external access is delayed, the arrangement does not lengthen the substantial access time, which starts counting from the time point of a last variation in address under the condition of the occurrence of an address skew. Namely extension of the level-H time period of the ATD signal does not cause any significant problems.

In the case of the occurrence of an address skew, the level-H time period of the ATD signal is kept by the specific length TW since the detection of the variation in address (that is, the rise of the pulse of the OATD signal). The ATD signal thus ensures absorption of the address skew.

G. Application to Electronic Apparatus

FIG. 18 is a perspective view illustrating a cellular phone 600 as one application of a semiconductor device of the present invention to an electronic apparatus. The cellular phone 600 has a main body 610 and a cover member 620. The main body 610 has a keyboard 612, a liquid crystal display 614, a receiver module 616, and an aerial module 618. The cover member 620 has a microphone module 622.

FIG. 19 is a block diagram illustrating the electrical construction of the cellular phone 600 shown in FIG. 18. A CPU 630 is connected to the keyboard 612, an LCD driver 632 for actuating the liquid crystal display 614, an SRAM 640, a VSRAM 642, and an EEPROM 644 via bus lines.

The SRAM 640 is used, for example, as a high-speed cache memory. The VSRAM 642 is used, for example, as a working memory for image processing. The memory chip 300 described above is applicable for the VSRAM (virtual SRAM) 642. The EEPROM 644 is used to store various settings of the cellular phone 600.

The VSRAM 642 is kept in the snooze state to pause the operations of the cellular phone 600. In this state, the VSRAM 642 automatically carries out internal refresh, so that data in the VSRAM 642 can be held. The memory chip 300 of the embodiment has a relatively large capacity and thus advantageously holds a mass of data, such as image data, for a long time period.

H Modifications

The above embodiments and their application are to be considered in all aspects as illustrative and not restrictive.

There may be many modifications, changes, and alterations without departing from the scope or spirit of the main characteristics of the present invention. Some examples of possible modification are given below.

(1) In the arrangement of the embodiment discussed above, the ATD signal rises from the level L to the level H with a variation in address. The ATD signal may alternatively be designed to fall from the level H to the level L with a variation in address. In the latter case, the refresh starts at the timing of a fall of the ATD signal, whereas the external access starts at the timing of a rise of the ATD signal. The time period of the level L between a fall and a rise of the ATD signal is set, instead of the level-H time period discussed above.

(2) In the first embodiment discussed above, the level-H time period of the ATD signal is fixed. The technique of the present invention is, however, not restricted to this arrangement. The level-H time period of the ATD signal may be variable in a specific range that is not shorter than the allowable address skew range and not longer than the time period between the timing of a rise of the ATD signal, at which the refreshing operation starts, and conclusion of the refreshing operation.

(3) In the above embodiments, the memory cell array 20 is divided into the four blocks 20A through 20D. The memory cell array 20 may alternatively be treated as one integral block. In the latter structure, the memory chip 300 has one row pre-decoder, one block controller, and one refresh requirement signal generation circuit, instead of the row pre-decoders 30A through 30D, the block controllers 40A through 40D, and the refresh requirement signal generation circuits 50A through 50D provided for the respective blocks in the structure of FIG. 4. In this case, the address does not include the block address but has only the row address and the column address.

(4) In the above embodiments, the lower-most 2-bit address A0 and A1 represents the block address, the 6-bit address A2 through A7 upper than the block address A0 and A1 represents the column address, and the upper-most 12-bit address A8 through A19 represents the row address. The technique of the present invention is, however, not restricted to this arrangement, but is applicable to any arbitrary combination of the block address, the column address, and the row address mapped to the respective bits.

The scope and spirit of the present invention are indicated by the appended claims, rather than by the foregoing description.

What is claimed is:

1. A semiconductor memory device, comprising:
    a memory cell array of dynamic memory cells;
    an address transition detection module that detects a variation of an externally given address by at least one bit and generates an address transition detection signal, which shifts to a second state in response to detection of the variation of the address in a first state and re-shifts to the first state when a preset reference time period elapses since the shift to the second state;
    a refresh control module that starts a refreshing operation of a desired memory cell included in the memory cell array, based on a timing of the shift of the address transition detection signal from the first state to the second state; and
    an external access control module that starts an external access to a memory cell in the memory cell array specified by the externally given address, based on a timing of the re-shift of the address transition detection signal from the second state to the first state or a timing of conclusion of the refreshing operation, wherein the reference time period is set to be not shorter than a preset allowable address skew range with regard to the address and not to be longer than a time period between the shift of the address transition detection signal to the second state and the conclusion of the refreshing operation.

2. A semiconductor memory device, comprising:

a memory cell array of dynamic memory cells;

an address transition detection module that detects a variation of an externally given address by at least one bit and generates an address transition detection signal, which shifts to a second state in response to detection of the variation of the address in a first state and re-shifts to the first state when a preset reference time period elapses since the shift to the second state;

a refresh control module that starts a refreshing operation of a desired memory cell included in the memory cell array, based on a timing of the shift of the address transition detection signal from the first state to the second state; and an external access control module that starts an external access to a memory cell in the memory cell array specified by the externally given address, based on a timing of the re-shift of the address transition detection signal from the second state to the first state or a timing of conclusion of the refreshing operation, wherein the reference time period is set to a specific length, which is not shorter than a preset allowable address skew range with regard to the address, and the address transition detection module extends the reference time period in response to detection of the variation of the address while the address transition detection signal is in the second state.

3. A semiconductor memory device in accordance with claim 2, wherein the address transition detection module extends the reference time period to maintain the second state for a predetermined time in response to detection of the variation of the address while the address transition detection signal is in the second state.

* * * * *